United States Patent
Kagawa et al.

(10) Patent No.: US 10,510,843 B2
(45) Date of Patent: *Dec. 17, 2019

(54) INSULATED GATE SILICON CARBIDE SEMICONDUCTOR DEVICE AND METHOD FOR MANUFACTURING SAME

(71) Applicant: MITSUBISHI ELECTRIC CORPORATION, Chiyoda-ku (JP)

(72) Inventors: Yasuhiro Kagawa, Tokyo (JP); Rina Tanaka, Chiyoda-ku (JP); Yutaka Fukui, Tokyo (JP); Naruhisa Miura, Tokyo (JP); Yuji Abe, Tokyo (JP); Masayuki Imaizumi, Tokyo (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/646,328

(22) Filed: Jul. 11, 2017

(65) Prior Publication Data

US 2017/0309711 A1     Oct. 26, 2017

Related U.S. Application Data

(63) Continuation of application No. 14/762,967, filed as application No. PCT/JP2014/000569 on Feb. 4, 2014, now Pat. No. 9,741,797.

(30) Foreign Application Priority Data

Feb. 5, 2013    (JP) .................................. 2013-020666

(51) Int. Cl.
*H01L 29/16*    (2006.01)
*H01L 29/04*    (2006.01)
(Continued)

(52) U.S. Cl.
CPC ...... *H01L 29/1608* (2013.01); *H01L 21/0259* (2013.01); *H01L 21/02532* (2013.01);
(Continued)

(58) Field of Classification Search
CPC .................................................... H01L 29/1608
See application file for complete search history.

(56) References Cited

U.S. PATENT DOCUMENTS

| | | | |
|---|---|---|---|
| 5,814,858 A | | 9/1998 | Williams |
| 6,091,107 A | * | 7/2000 | Amaratunga ....... H01L 29/7397 257/133 |

(Continued)

FOREIGN PATENT DOCUMENTS

| | | |
|---|---|---|
| CN | 1536680 A | 10/2004 |
| CN | 101401212 A | 4/2009 |

(Continued)

OTHER PUBLICATIONS

Combined Office Action and Search Report dated Sep. 5, 2017 in Chinese Patent Application No. 201480007472.8 (with unedited computer generated English translation).

(Continued)

*Primary Examiner* — Eugene Lee
(74) *Attorney, Agent, or Firm* — Oblon, McClelland, Maier & Neustadt, L.L.P.

(57) ABSTRACT

An insulated gate silicon carbide semiconductor device includes: a drift layer of a first conductivity type on a silicon carbide substrate of 4H type with a {0001} plane having an off-angle of more than 0° as a main surface; a first base region; a source region; a trench; a gate insulating film; a protective diffusion layer; and a second base region. The trench sidewall surface in contact with the second base region is a surface having a trench off-angle of more than 0° in a <0001> direction with respect to a plane parallel to the (Continued)

<0001> direction. The insulated gate silicon carbide semiconductor device can relieve an electric field of a gate insulating film and suppress an increase in on-resistance and provide a method for manufacturing the same.

26 Claims, 23 Drawing Sheets

(51) Int. Cl.
    *H01L 29/423*     (2006.01)
    *H01L 29/66*     (2006.01)
    *H01L 21/02*     (2006.01)
    *H01L 29/78*     (2006.01)
    *H01L 29/06*     (2006.01)
    *H01L 29/10*     (2006.01)
    *H01L 29/739*     (2006.01)
    *H01L 21/265*     (2006.01)

(52) U.S. Cl.
    CPC ........ *H01L 21/02609* (2013.01); *H01L 29/04* (2013.01); *H01L 29/045* (2013.01); *H01L 29/0623* (2013.01); *H01L 29/0634* (2013.01); *H01L 29/1095* (2013.01); *H01L 29/4236* (2013.01); *H01L 29/66068* (2013.01); *H01L 29/66348* (2013.01); *H01L 29/66734* (2013.01); *H01L 29/7397* (2013.01); *H01L 29/7813* (2013.01); *H01L 21/26586* (2013.01); *H01L 29/0696* (2013.01)

(56) References Cited

U.S. PATENT DOCUMENTS

| | | | |
|---|---|---|---|
| 6,930,352 B2 | 8/2005 | Saito et al. | |
| 7,279,743 B2 | 10/2007 | Pattanayak et al. | |
| 7,361,558 B2 | 4/2008 | Pattanayak et al. | |
| 7,833,863 B1 | 11/2010 | Pattanayak et al. | |
| 7,999,312 B2 | 8/2011 | Takaya et al. | |
| 8,319,314 B2* | 11/2012 | Ogura | H01L 29/0834 257/564 |
| 8,395,162 B2 | 3/2013 | Nakano et al. | |
| 8,563,981 B2 | 10/2013 | Nakano et al. | |
| 8,816,355 B2 | 8/2014 | Onose | |
| 9,224,825 B2 | 12/2015 | Nakano et al. | |
| 9,601,582 B2 | 3/2017 | Nakano et al. | |
| 2002/0158251 A1 | 10/2002 | Takahashi et al. | |
| 2004/0195618 A1 | 10/2004 | Saito et al. | |
| 2005/0233539 A1* | 10/2005 | Takeuchi | H01L 29/045 438/400 |
| 2007/0181939 A1 | 8/2007 | Huang et al. | |
| 2007/0187695 A1 | 8/2007 | Nakamura | |
| 2009/0236612 A1* | 9/2009 | Nakamura | H01L 21/046 257/77 |
| 2010/0013009 A1 | 1/2010 | Pan | |
| 2010/0213505 A1 | 8/2010 | Hirler | |
| 2010/0224932 A1 | 9/2010 | Takaya et al. | |
| 2010/0285646 A1* | 11/2010 | Lin | H01L 21/26586 438/270 |
| 2011/0017998 A1 | 1/2011 | Nakano et al. | |
| 2012/0248461 A1* | 10/2012 | Masuda | H01L 21/3065 257/77 |
| 2012/0248462 A1 | 10/2012 | Wada | |
| 2012/0273801 A1 | 11/2012 | Watanabe et al. | |
| 2012/0319136 A1* | 12/2012 | Noborio | H01L 29/1095 257/77 |
| 2013/0001592 A1 | 1/2013 | Miyahara et al. | |
| 2013/0168699 A1 | 7/2013 | Nakano et al. | |
| 2013/0200451 A1* | 8/2013 | Yilmaz | H01L 29/4236 257/331 |
| 2014/0014972 A1 | 1/2014 | Nakano et al. | |
| 2016/0087046 A1 | 3/2016 | Nakano et al. | |
| 2017/0154971 A1 | 6/2017 | Nakano et al. | |

FOREIGN PATENT DOCUMENTS

| | | |
|---|---|---|
| CN | 101964362 A | 2/2011 |
| CN | 102856382 A | 1/2013 |
| CN | 102859698 A | 1/2013 |
| DE | 10 2007 001 643 A1 | 7/2007 |
| DE | 10 2010 000 531 A1 | 10/2010 |
| EP | 0893830 A1 | 1/1999 |
| JP | 2001-267570 A | 9/2001 |
| JP | 2002-329670 | 11/2002 |
| JP | 2004-311716 A | 11/2004 |
| JP | 2005-333068 A | 12/2005 |
| JP | 2007-129259 A | 5/2007 |
| JP | 2007-513523 A | 5/2007 |
| JP | 2007-523487 A | 8/2007 |
| JP | 3964819 | 8/2007 |
| JP | 2007-242852 A | 9/2007 |
| JP | 2010-040652 | 2/2010 |
| JP | 2011-222681 A | 11/2011 |
| JP | 2012-234908 | 11/2012 |
| JP | 2013-12590 A | 1/2013 |
| JP | 2013-214661 A | 10/2013 |
| WO | 2005/057615 A2 | 6/2005 |
| WO | 2005/057615 A3 | 6/2005 |
| WO | 2005/081323 A2 | 9/2005 |
| WO | 2005/081323 A3 | 9/2005 |

OTHER PUBLICATIONS

Office Action dated May 16, 2018 in Chinese Patent Application No. 201480007472.8 (with English language translation).
International Search Report dated Apr. 8, 2014 in PCT/JP2014/000569 filed Feb. 4, 2014.
International Preliminary Report of Patentability and Written Opinion dated Aug. 11, 2015 in PCT/JP2014/00569 (with English translation).
Office Action dated Aug. 9, 2016 in Japanese Patent Application No. 2014-560678 (with partial English language translation).
Office Action dated Feb. 7, 2017, in Japanese Patent Application No. 2014-560678 (with partial English language translation).
Combined Office Action and Search Report dated Feb. 4, 2017 in Chinese Patent Application No. 201480007472.8 With partial English translation.
Japanese Office Action dated Jan. 9, 2018, in Japanese Patent Application No. 2017-089787 (with English translation), 9 pages.
Office Action dated Jun. 27, 2018 in German Patent Application No. 112014000679.3, (with English translation), 8 pages.
Office Action dated May 22, 2018 in Japanese Patent Application No. 2017-089787 (with unedited computer generated English translation), 8 pages.
Office Action dated Jan. 9, 2018 in Japanese Patent Application No. 2017-089787 (submitting English translation only), 4 pages.
Japanese Office Action dated Mar. 12, 2019 in Patent Application No. 2018-136000 (with unedited computer generated English translation), 9 pages.
Japanese Office Action dated Sep. 10, 2019, issued in Japanese Patent Application No. 2018-136000 (with English translation).

* cited by examiner

FIG. 3
(a)
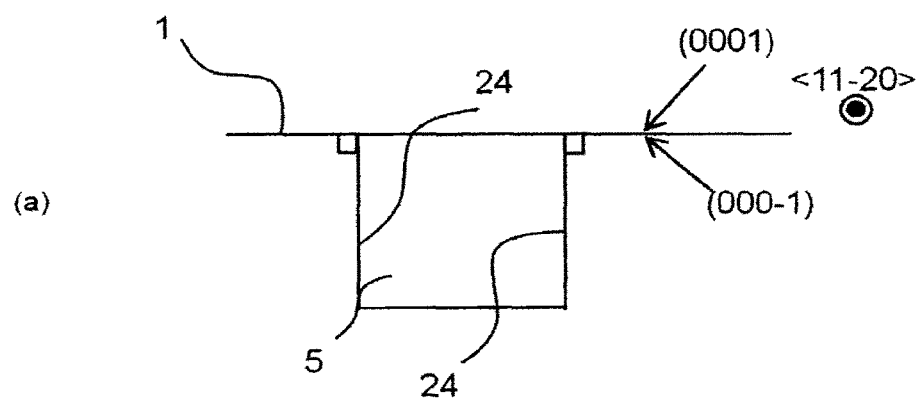
(b)
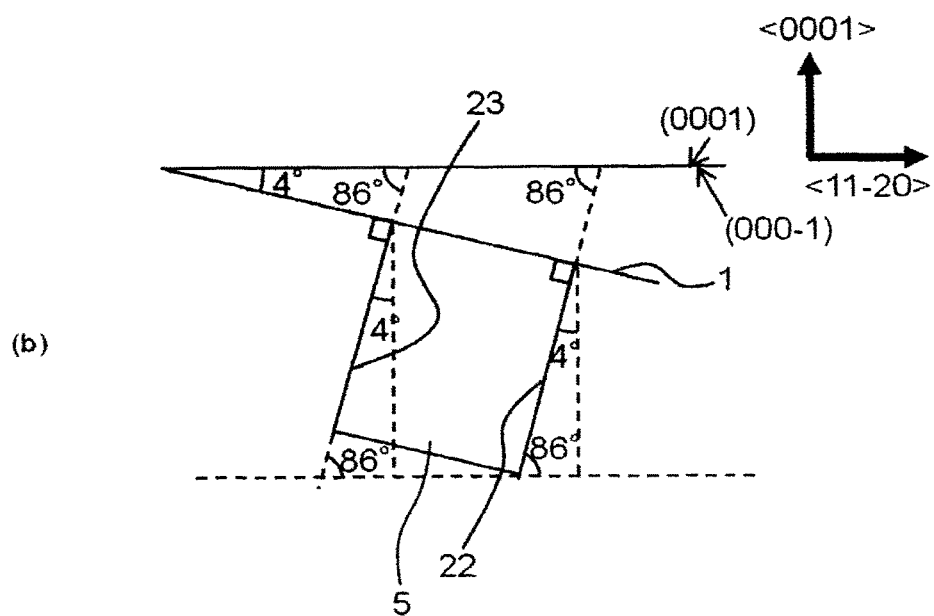

F I G. 4
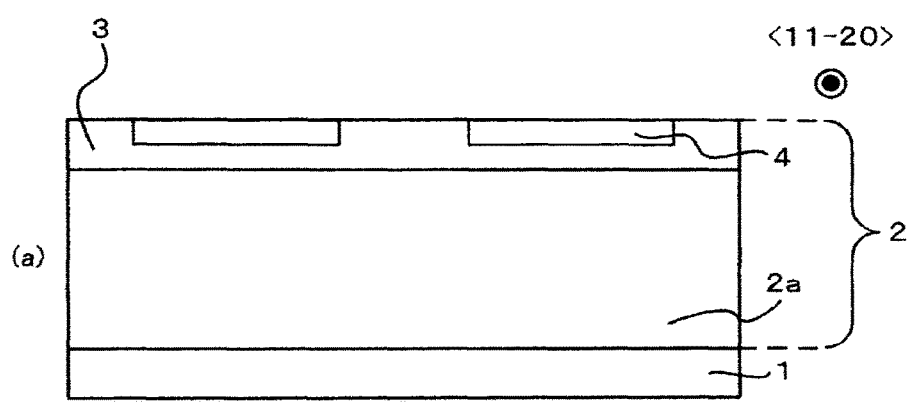
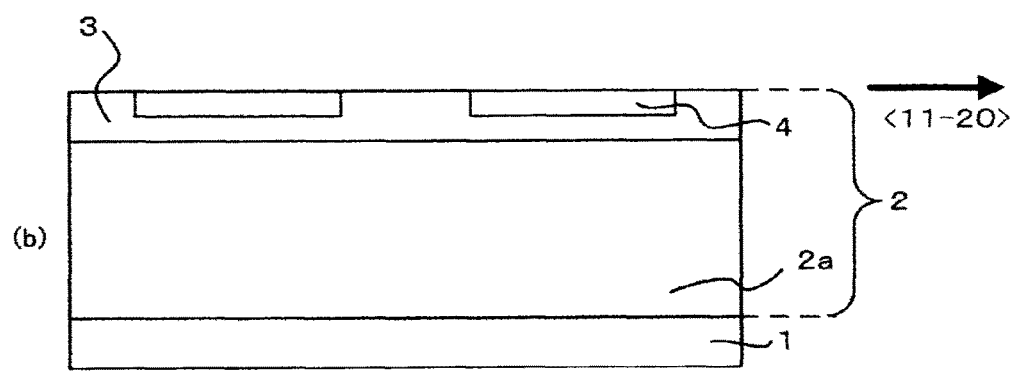

FIG. 7
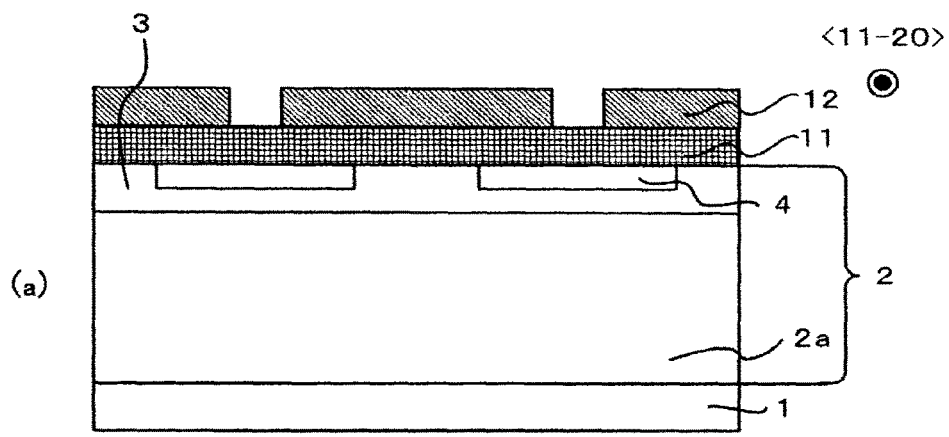
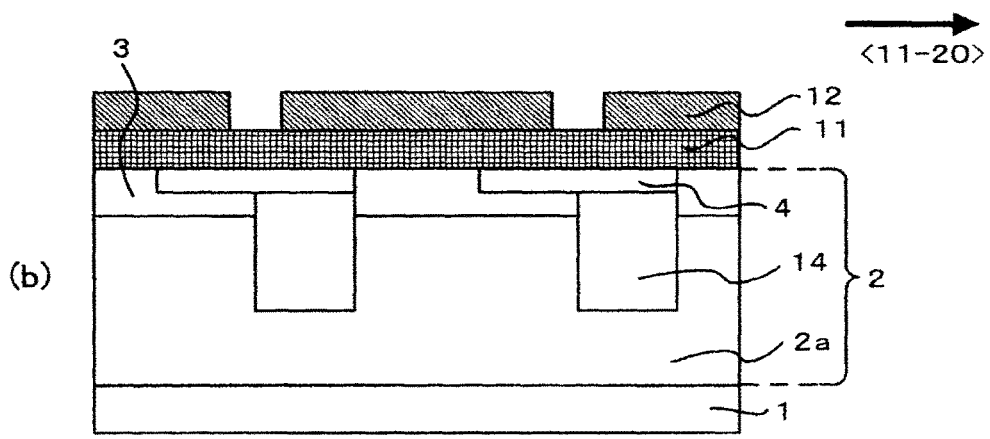

F I G. 1 0
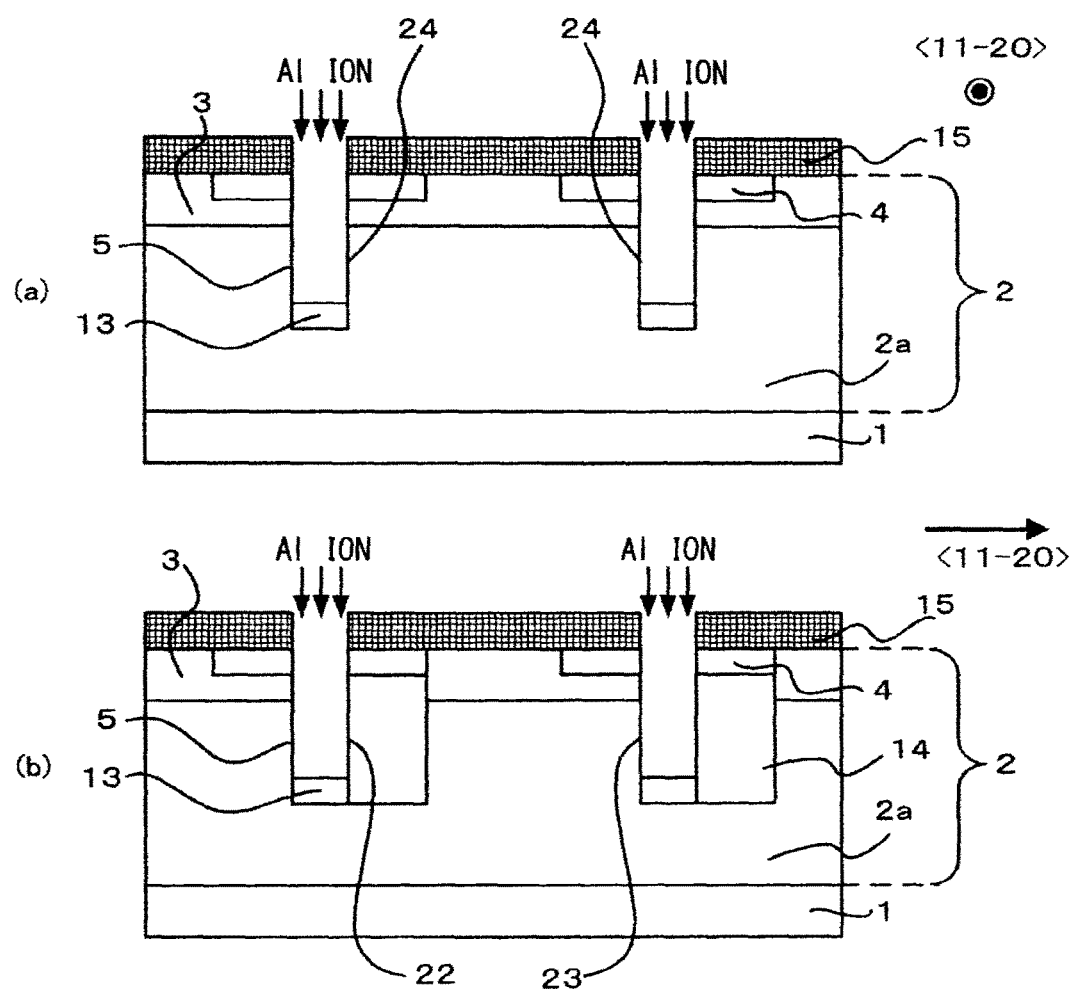

FIG. 14
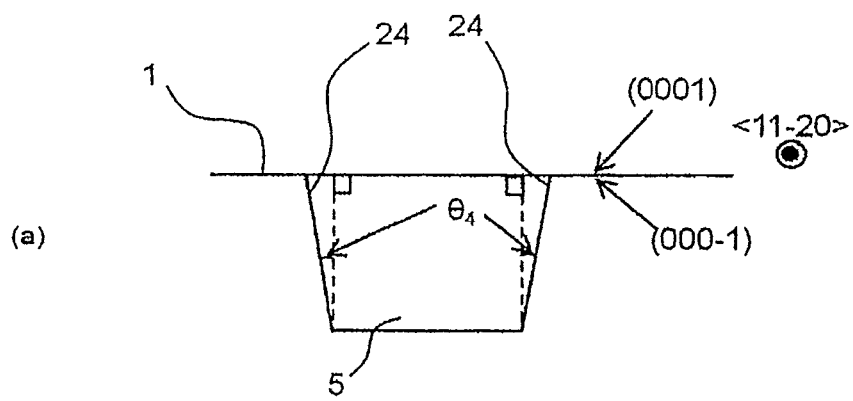
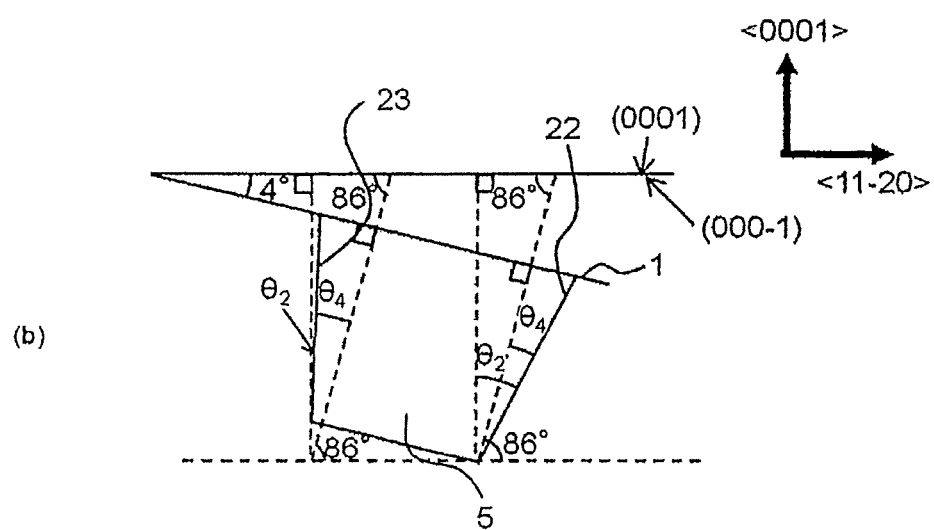

FIG. 22
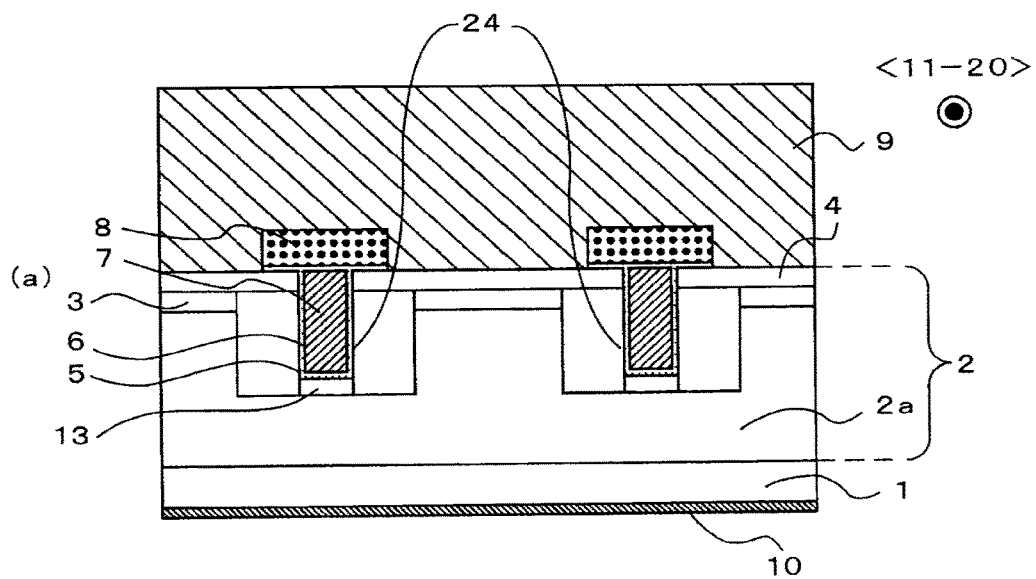
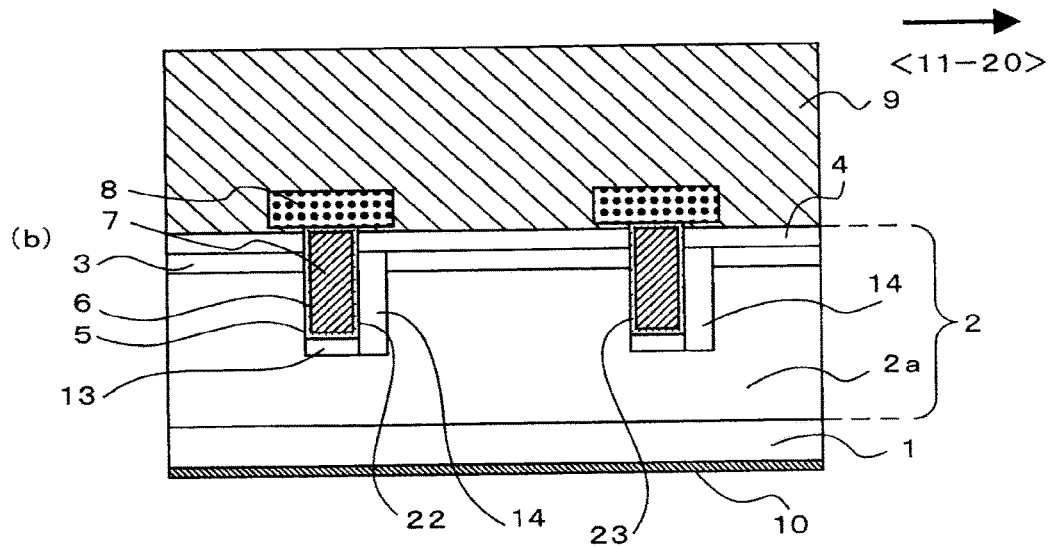

F I G. 2 3
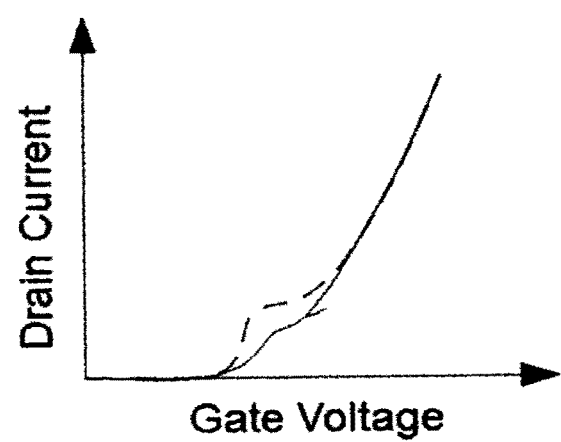

INSULATED GATE SILICON CARBIDE SEMICONDUCTOR DEVICE AND METHOD FOR MANUFACTURING SAME

CROSS-REFERENCE TO RELATED APPLICATIONS

This application is a continuation of and claims the benefit of priority from U.S. application Ser. No. 14/762,967, filed on Jul. 23, 2015, which claims the benefit of prior International Application No. PCT/JP2014/000569 filed on Feb. 4, 2014, which is based upon and claims the benefit of priority from Japanese Patent Application No. 2013-020666 filed on Feb. 5, 2013; the entire contents of which are incorporated herein by reference.

TECHNICAL FIELD

The present invention relates to an insulated gate silicon carbide semiconductor device having a trench-gate structure.

BACKGROUND ART

In the power electronics field, semiconductor devices, such as insulated gate bipolar transistors (IGBTs) and metal oxide semiconductor field effect transistors (MOSFETs), are widely used as switching elements that control power supply to loads such as motors. Insulated gate semiconductor devices for power control include trench MOSFETs in which gate electrodes are buried in semiconductor layers.

In the conventional trench MOSFET, upon application of high voltage, an electric field is also applied to a silicon oxide film being a gate insulating film. Here, of the silicon oxide film formed in a trench along a trench shape, the highest electric field is applied to the silicon oxide film on a bottom of the trench in which a gate electrode is buried. To relieve the electric field applied to the silicon oxide film on the bottom of the trench, a method for forming a protective diffusion layer of a p-type in a drift layer of a n-type in contact with the bottom of the trench has been developed (for example, see Patent Document 1).

Here, the protective diffusion layer of the p-type is electrically connected to a first base region of the p-type in which a channel region is formed with a second base region of the p-type that is in contact with a trench side wall and is formed in the drift layer of the n-type, whereby a potential is fixed. A trench sidewall surface on which the second base region is formed is in a p-type region, so that MOS characteristics deteriorate. In other words, the trench sidewall surface on which the second base region is formed hardly functions as the channel, thereby reducing a density of the channel in the trench MOSFET and increasing on-resistance of the trench MOSFET.

PRIOR ART DOCUMENT

Patent Document

Patent Document 1: Japanese Patent Application Laid-Open No. 2004-311716

SUMMARY OF INVENTION

Problems to be Solved by the Invention

A trench MOSFET including silicon carbide, namely, SiC is inferior in quality of a MOS interface to a trench MOS-FET including silicon, so that the channel resistance greatly accounts for the on-resistance. Thus, the trench MOSFET including silicon carbide has a problem that the increase in the on-resistance due to the decrease in the density of the channel is extremely greater in comparison with silicon. Therefore, it is desirable that the increase in the on-resistance is prevented as much as possible when the second base region is formed in the trench MOSFET including silicon carbide.

The present invention has been made in view of the above mentioned problems, and an object thereof is to provide an insulated gate silicon carbide semiconductor device capable of relieving an electric filed applied to a gate insulating film upon application of high voltage and suppressing an increase in on-resistance and to provide a method for manufacturing the same.

Means to Solve the Problems

An insulated gate silicon carbide semiconductor device according to the present invention includes a protective diffusion layer in contact with a bottom of a trench and a second base region that connects the protective diffusion layer and a first base region. The second base region is formed in contact with a trench sidewall surface having a trench off-angle of more than 0° in a <0001> direction with respect to a plane parallel to the <0001> direction.

Effects of the Invention

In the insulated gate silicon carbide semiconductor device in the present invention, the protective diffusion layer is provided on the bottom of the trench, which can relieve an electric field of a gate insulating film on the bottom of the trench, and the second base region for fixing a potential of the protective diffusion layer is formed on at least part of at least one of a plurality of trench sidewall surfaces, which can suppress an increase in on-resistance.

BRIEF DESCRIPTION OF DRAWINGS

FIG. 3 is a schematic diagram showing relationships of angles between a main surface of a silicon carbide substrate and a trench side wall in the trench MOSFET according to the first embodiment of the present invention.

FIG. 4 is a cross-sectional view for describing a method for manufacturing the trench MOSFET according to the first embodiment of the present invention until formation of a source region.

FIG. 7 is a cross-sectional view for describing formation of an etching mask for the trench in the method for manufacturing the trench MOSFET according to the first embodiment of the present invention.

FIG. 10 is a cross-sectional view for describing the method for manufacturing the trench MOSFET according to the first embodiment of the present invention until formation of a protective diffusion layer.

FIG. 14 is a schematic diagram showing relationships of angles between a main surface of a silicon carbide substrate and a trench side wall in a trench MOSFET according to a second embodiment of the present invention.

FIG. 22 is a cross-sectional view showing the trench MOSFET according to the sixth embodiment of the present invention.

FIG. 23 shows characteristics of a drain current with respect to a gate voltage for describing effects of the trench MOSFET according to the sixth embodiment of the present invention.

DESCRIPTION OF EMBODIMENTS

First Embodiment

Figure 1:
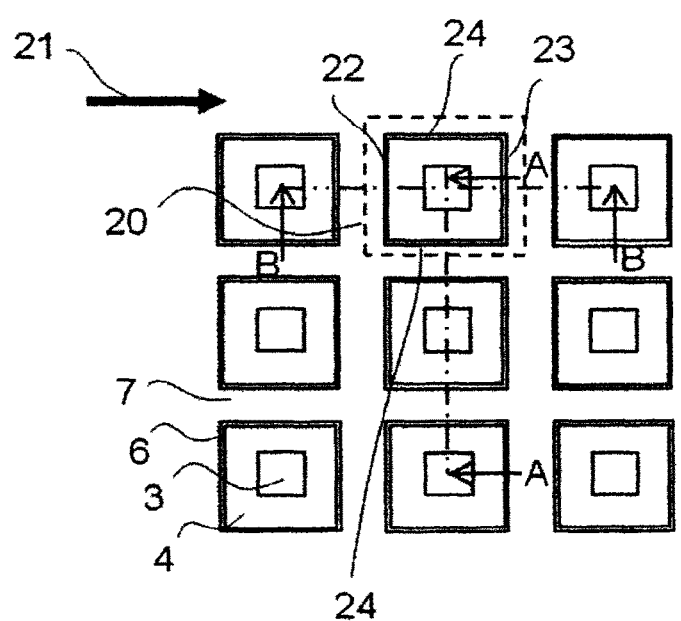
FIG. 1 is a top view showing part of a trench MOSFET according to a first embodiment of the present invention.
Figure 2:
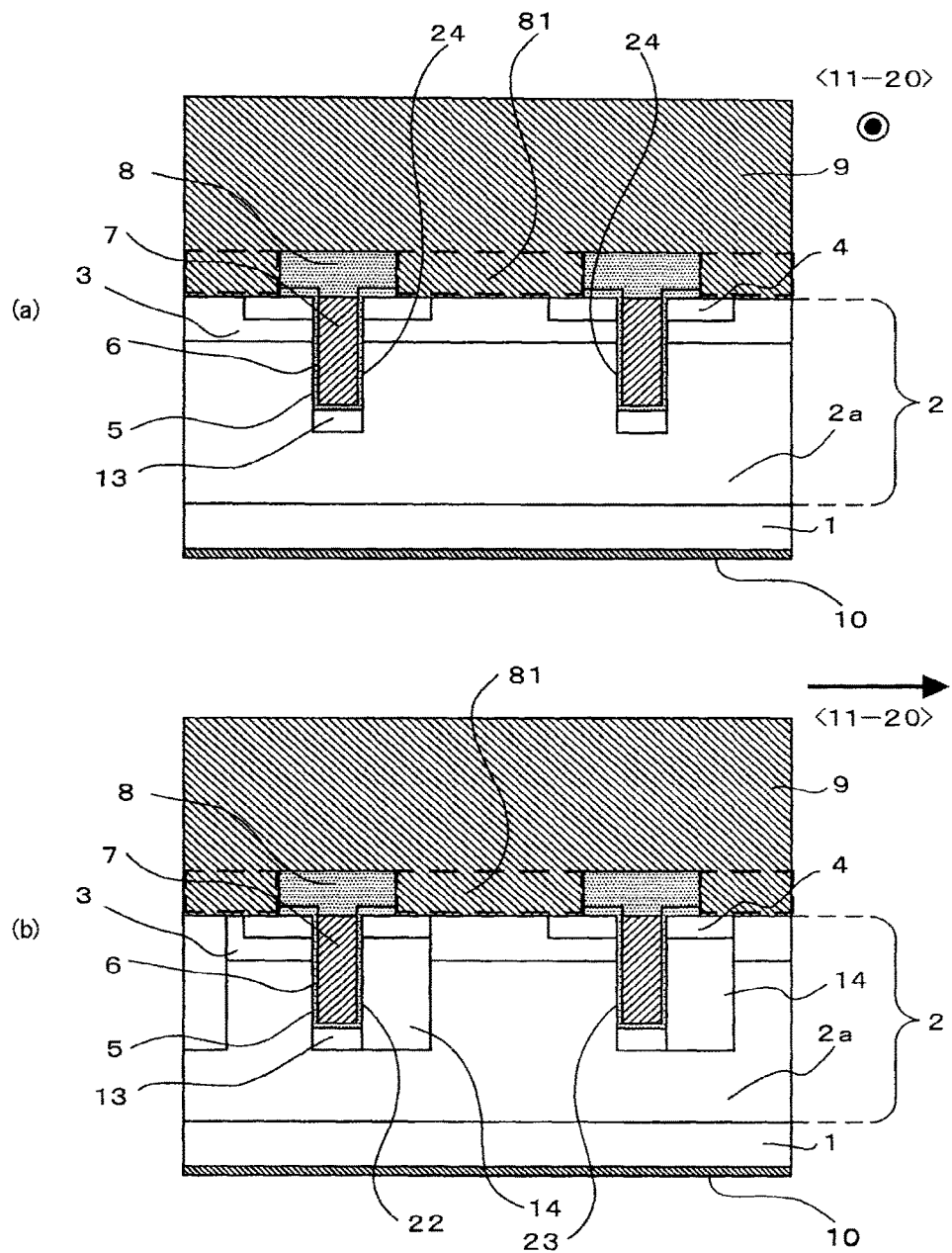
FIG. 2 is a cross-sectional view of the trench MOSFET according to the first embodiment of the present invention.

First, a configuration of an insulated gate silicon carbide semiconductor device in a first embodiment of the present invention is described. FIG. 1 is a top view showing part of a trench MOSFET according to the first embodiment. In FIG. 1, a source electrode, an interlayer insulating film, and a contact hole that cover upper portions of cells are omitted to make a configuration of the cells of the trench MOSFET easy to see. FIG. 2 is a cross-sectional view of the trench MOSFET according to the first embodiment. In this embodiment, the trench MOSFET including silicon carbide is described as the insulated gate silicon carbide semiconductor device.

In FIG. 1, one cell 20 shown in a region surrounded by a dotted line includes nine cells disposed in a grid pattern. An A-A cross-sectional view shown by an alternate long and short dashed line in FIG. 1 corresponds to a part (a) of FIG. 2, and a B-B cross-sectional view shown by a chain doubled dashed line in FIG. 1 corresponds to a part (b) of FIG. 2. An off-direction 21 of a silicon carbide substrate 1 shown in FIG. 1 is a <11-20> direction in this embodiment, and the part (a) of FIG. 2 shows a section of trench side walls 24 parallel to the off-direction 21. Moreover, trench side walls perpendicular to the off-direction 21 are an off-upstream trench side wall 22 and an off-downstream trench side wall 23, which are shown in the part (b) of FIG. 2.

A configuration of the one cell 20 of the trench MOSFET according to this embodiment is described with reference to FIGS. 1 and 2. A first base region 3 of a second conductivity type is formed in an epitaxial layer 2 that is made of silicon carbide of a first conductivity type and is grown on a main surface of the silicon carbide substrate 1 of the first conductivity type. Of the epitaxial layer 2 of the first conductivity type, a region in which the first base region 3 of the second conductivity type is not formed is a drift layer 2a.

In addition, the first conductivity type is the n-type, and the second conductivity type is the p-type in this embodiment.

Here, a polytype of the silicon carbide substrate 1 of the n-type is 4H. In other words, 4H-SiC (silicon carbide of 4H type) of the n-type (first conductivity type) is used for the silicon carbide substrate 1.

Further, the main surface of the silicon carbide substrate 1 being used is a (0001) plane or a (000-1) plane having an off-angle $\theta_1$ of more than 0° with respect to the off-direction 21. In other words, the silicon carbide substrate 1 is assumed to be any one of an off-substrate having an Si plane and an off-substrate having a C plane. In this embodiment, description as an example is given on the assumption that the off-direction 21 is the <11-20> direction, the off-angle $\theta_1$ is 4°, and the main surface of the silicon carbide substrate 1 is the (0001) plane having the off-angle of 4° with respect to the <11-20> direction.

A source region 4 of the first conductivity type (n-type) is formed in the first base region 3 located on a surface side of the drift layer 2a. A trench 5 in which a gate electrode 7 is buried is formed in the epitaxial layer 2 so as to penetrate the source region 4 and the first base region 3. In other words, a bottom of the trench 5 reaches the drift layer 2a under the first base region 3. A gate insulating film 6 being a silicon oxide film is provided on an inner wall of the trench 5 along the shape of the trench 5. Furthermore, the gate electrode 7 is buried in the trench 5 through the gate insulating film 6, the inner wall of the trench 5 surrounding the inside thereof.

A protective diffusion layer 13 of the second conductivity type (p-type) is formed in a region of the drift layer 2a in contact with the bottom of the trench 5. The protective diffusion layer 13 accelerates depletion of the n-type (first conductivity type) region in the drift layer 2a in an OFF state of the trench MOSFET and also relieves a concentration of an electric field on the bottom of the trench 5 to reduce the electric field applied to the gate insulating film 6, thereby preventing a breakdown in the gate insulating film 6.

An interlayer insulating film 8 is formed on the surface of the epitaxial layer 2 so as to cover the gate electrode 7. A contact hole 81 that reaches the source region 4 and the first base region 3 is formed in the interlayer insulating film 8. The contact hole 81 corresponds to a region surrounded by a dotted line in FIG. 2. A source electrode 9 located on the interlayer insulating film 8 is formed to fill the contact hole 81 and is connected to the source region 4 and the first base region 3. In addition, as already mentioned above, the interlayer insulating film 8, the source electrode 9, the contact hole 81 on the epitaxial layer 2 are omitted in FIG. 1, so that FIG. 1 does not show the contact hole 81, but the contact hole 81 whose section is shown in FIG. 2 is a rectangular space in a top view.

A drain electrode 10 is formed on a back surface of the silicon carbide substrate 1.

As shown in FIG. 1, the gate electrode 7 is disposed in the grid pattern in the top view. The protective diffusion layer 13 extends in the grid pattern in the drift layer 2a on the bottom of the trench 5 in which the gate electrode 7 is buried (not shown), similarly to the gate electrode 7. The cells 20 located in an active region of the trench MOSFET have sections (cells 20) defined by the gate electrode 7, and each of them functions as the trench MOSFET.

In other words, the trench MOSFET is formed of the active region in which the cells 20 are disposed and a termination region except for the active region, and in this embodiment, all the trenches 5 in the active region are provided with the protective diffusion layer 13. Thus, the trenches 5 in all the cells 20 in the active region are provided with the protective diffusion layer 13.

In this embodiment, the trench 5 is formed in the cell 20, and a second base region 14 of the p-type (second conductivity type) is formed in contact with at least one surface of four surfaces being a trench side wall to electrically connect the first base region 3 and the protective diffusion layer 13, as shown in the part (b) of FIG. 2. The trench sidewall surface in contact with the second base region 14 corresponds to a side of four sides of the cell 20 quadrilateral in FIG. 1 in which the gate insulating film 6 is formed and corresponds to the off-upstream trench side wall 22.

Also in the part (a) of FIG. 2 and the part (b) of FIG. 2, it is clear that the second base region 14 is formed on the trench sidewall surface on the right side of the trench 5 in the part (b) of FIG. 2. Of the surfaces perpendicular to the off-direction 21 of the cell 20, the off-upstream trench side wall 22 is provided with the second base region 14.

In the part (b) of FIG. 2 in this embodiment, of the trench sidewall surfaces perpendicular to the off-direction 21, the second base region 14 is formed on the off-upstream trench side wall 22, and it may be formed on the off-downstream trench side wall 23. In other words, in this embodiment, the trench side wall is formed of the trench side walls 24 parallel to the off-direction, the off-upstream trench side wall 22, and the off-downstream trench side wall 23, and the second base region 14 should not be formed in contact with the trench side walls 24 parallel to the off-direction. The trench sidewall surface on which the second base region 14 is formed is a characteristic portion in this embodiment, which is described below in detail.

In the part (b) of FIG. 2, the second base region 14 is formed in contact with the off-upstream trench side wall 22 of the trench 5, and the second base region 14 of the p-type (second conductivity type) is provided inside the drift layer 2a so as to be in contact with the bottom of the first base region 3, the protective diffusion layer 13, and the off-upstream trench side wall 22, so that the second base region 14 has the structure that electrically connects the protective diffusion layer 13 of the p-type (second conductivity type) and the first base region 3 of the p-type (second conductivity type).

The first base region 3 is connected to the source electrode 9 in the surface of the epitaxial layer 2, and the protective diffusion layer 13 of the p-type (second conductivity type) located on the bottoms of the trenches 5 of all the cells 20 in the active region is electrically connected to the source electrode 9 through the second base region 14 of the p-type (second conductivity type) and the first base region 3 of the p-type (second conductivity type). Thus, the protective diffusion layer 13 is not in a state of electrically floating (floating state), so that the potential is stable. In addition, the second base region 14 is insulated from the gate electrode 7 by the gate insulating film 6.

In this embodiment, the protective diffusion layer 13 is provided on the bottoms of the trenches 5 of all the cells 20 in the active region. This can relieve an electric field applied to the gate insulating film 6 on the bottoms of all the trenches 5 located in the active region of the trench MOSFET and can suppress dielectric breakdown in the gate insulating film 6 upon application of high voltage.

Herein, silicon carbide that is a wideband gap semiconductor can achieve high voltage characteristics in comparison with silicon. When a voltage to the extent that electric field strength at a pn junction between the first base region 3 of the p-type and the drift layer 2a of the n-type causes an avalanche is applied to the trench MOSFET including silicon carbide, electric field strength of the gate insulating film 6 is the same as dielectric breakdown electric field strength of the silicon oxide film.

If the protective diffusion layer 13 is formed in all the cells 20 in the active region, namely, on the bottoms of all the trenches 5 in the trench MOSFET including silicon carbide, the electric field strength applied to the gate insulating film 6 on the bottoms of the trenches 5 can thus be relieved sufficiently. In other words, in the trench MOSFET including silicon carbide required to operate particularly under high voltage, the dielectric breakdown can be prevented from occurring in the gate insulating film 6 on the bottoms of the trenches 5 on which the protective diffusion layer 13 is not formed.

However, even if the protective diffusion layer 13 is formed only on the bottoms of the trenches 5 of part of the cells 20 in the active region, the effect of relieving to some extent the electric field strength applied to the gate insulating film 6 on the bottoms of the trenches 5 can be obtained, and the effects in this embodiment can also be obtained.

For example, for the trench MOSFET that is not required to operate at very high breakdown voltage, such as several hundreds to 1 kV, it suffices that the relief of the gate insulating film 6 from the electric field strength is obtained to some extent. In this case, the number of cells 20 in which the protective diffusion layer 13 and the second base region 14 are formed is reduced in the active region, so that an increase in on-resistance can be more suppressed.

It should be noted that the second base region 14 is always formed in the cell 20 in which the protective diffusion layer 13 is provided.

According to the configuration in this embodiment, the second base region 14 is provided in at least each of the cells 20, allowing for the electrical connection between the protective diffusion layer 13 and the source electrode 9.

In a case where the protective diffusion layer 13 is provided on the bottoms of the trenches 5 of all the cells 20 in the active region as in this embodiment, the second base region 14 is formed in contact with part of one surface of the side walls of the trenches 5 of all the cells 20 in the active region. In other words, the protective diffusion layer 13 and the second base region 14 are provided for each of the trenches 5 in the active region in this embodiment.

Next, operations of the trench MOSFET including silicon carbide are briefly described. When a positive voltage greater than or equal to a threshold voltage is applied to the gate electrode 7, an inversion channel layer is formed in a side surface (channel region) of the gate electrode 7 of the first base region 3. This inversion channel layer is a path through which electrons as carriers flow from the source region 4 to the drift layer 2a. The electrons flowing from the source region 4 to the drift layer 2a through the inversion channel layer follow an electric field generated by the positive voltage of the drain electrode 10 and reach the drain electrode 10 through the silicon carbide substrate 1. In this manner, the trench MOSFET can cause an ON-state current to flow from the drain electrode 10 to the source electrode 9. This state is an ON state of the MOSFET.

Here, channel regions in the trench sidewall surfaces except for the off-upstream trench side wall 22 on which the second base region 14 is formed have a distance from the bottom of the first base region 3 to the bottom of the source region 4 as a channel length. The off-upstream trench side wall 22 on which the second base region 14 is formed includes the second base region 14 formed close to the bottom of the trench 5, and has a distance from the bottom of the second base region 14 to the bottom of the source region 4 as a channel length. The channel length is thus longer than that of the other trench sidewall surfaces, whereby the inversion channel layer fails to be sufficiently formed, not functioning as the path through which the electrons flow, or resistance (channel resistance) in the channel region is greater than that of the other trench sidewall surfaces even if the inversion channel layer is formed. In other words, forming the second base region 14 increases the channel resistance, thereby increasing the resistance (on-resistance) in the ON state of the trench MOSFET.

On the other hand, when a voltage lower than or equal to the threshold voltage is applied to the gate electrode 7, the inversion channel layer is not formed in the channel region, whereby no current flows between the drain electrode 10 and the source electrode 9. This state is an OFF state of the trench MOSFET. An extremely greater drain voltage is applied in the OFF state than in the ON state.

Here, when the trench MOSFET is turned off from the ON state to the OFF state, the voltage of the drain electrode 10 is abruptly increased, for example, from several V to several hundreds of V, and thus a displacement current flows into the protective diffusion layer 13 through a parasitic capacity between the protective diffusion layer 13 of the second conductivity type and a region of the first conductivity type in the drift layer 2a. At this time, a voltage drop occurs in a resistance component between the protective diffusion layer 13 and the first base region 3. In other words, the voltage drop occurs around the trench 5, applying the electric field to the gate insulating film 6. If this increases, the dielectric breakdown occurs in the gate insulating film 6. The amount of the displacement current is determined by an area of the protective diffusion layer 13 and a fluctuation (dV/dt) in time (t) of the drain voltage (V).

To prevent the breakdown in the gate insulating film 6 due to the displacement current, it is effective to shorten the path through which the current flows in the protective diffusion layer 13 and reduce a resistance value between the protective diffusion layer 13 and the first base region 3.

In this embodiment, the protective diffusion layer 13 of the p-type (second conductivity type) located on the bottoms of the trenches 5 of all the cells 20 in the active region is electrically connected to the source electrode 9 through the second base region 14 of the p-type (second conductivity type) and the first base region 3 of the p-type (second conductivity type). Thus, if the displacement current occurs, it can flow from the protective diffusion layer 13 to the source electrode 9 through the second base region 14 and the first base region 3.

According to this embodiment, the protective diffusion layer 13 can be electrically connected to the source electrode 9 in at least each of the cells 20. This can shorten the distance between the protective diffusion layer 13 and the first base region 3 and can secure a great number of connection paths between the protective diffusion layer 13 and the source electrode 9. In other words, the distance of the path through which the displacement current flows to the source electrode 9 through the protective diffusion layer 13 can be shortened, so that the voltage drop around the trench 5 can be suppressed, and the electric field applied to the gate insulating film 6 can be reduced. Therefore, the breakdown in the gate insulating film 6 due to the displacement current can be prevented, and the trench MOSFET having high reliability can be obtained.

Moreover, the second base region 14 is provided for each of the cells 20 in the grid pattern, so that the current path in the protective diffusion layer 13 is shortened with a decrease in a cell size (cell pitch) of the section defined by the gate electrode 7, thereby obtaining greater effects. Therefore, according to this embodiment, the trench MOSFET can achieve in both of the high reliability and a large capacity by decreasing the cell pitch.

Here, the trench sidewall surface on which the second base region 14 as the characteristic of this embodiment is formed is described. The trench MOSFET including silicon carbide has different MOS characteristics according to a plane direction of a trench sidewall surface in which the channel region is formed. In other words, the channel resistance differs according to which plane direction the channel region is formed in. Thus, a relationship between the main surface of the silicon carbide substrate 1 and the trench sidewall surface on which the second base region 14 is formed is important.

In the cross-sectional view of the cell 20 shown in FIG. 2, the side wall of the trench 5 is conceivably formed at an angle of 90° with respect to the surface of the epitaxial layer 2. In other words, the side wall of the trench 5 is formed at the angle of 90° with respect to the main surface of the silicon carbide substrate 1.

At this time, relationships of angles between the trench side walls 24 parallel to the off-direction 21 of the silicon carbide substrate 1 and the silicon carbide substrate 1 are schematically shown in a part (a) of FIG. 3, the trench side walls 24 being shown in the A-A cross-sectional view in FIG. 1. Here, the off-direction 21 is in a direction perpendicular to the cross-sectional view in the part (a) of FIG. 3, so that the trench side walls 24 parallel to the off-direction are perpendicular to the (0001) plane and are a (1-100) plane or a (-1100) plane parallel to the <11-20> direction.

Here, a plane that the (0001) plane is tilted 90° in a <1-100> direction is the (1-100) plane, and a plane that the (000-1) is tilted 90° in the <1-100> direction is the (-1100) plane. A {1100} plane represents any one of the (1-100)

plane and (−1100) plane. The (1-100) plane and the (000-1) plane are known to have the same MOS characteristics.

On the other hand, relationships between the trench side walls perpendicular to the off-direction 21 and the silicon carbide substrate 1 are schematically shown in a part (b) of FIG. 3, the trench side walls being shown in the B-B cross-sectional view in FIG. 1. In the part (b) of FIG. 3, the main surface of the silicon carbide substrate 1 is a plane having an off-angle of 4° in the off-direction 21 with respect to the (0001) plane. Thus, the off-upstream trench side wall 22 is a plane that the (0001) plane is tilted 86° in the <11-20> direction, and it is a 4°-off (11-20) plane that the (11-20) plane is tilted 4° in a <0001> direction. Moreover, the off-downstream trench side wall 23 is a plane that the (000-1) plane is tilted 86° in the <11-20> direction, and it is a 4°-off (−1-120) plane that a (−1-120) plane is tilted 4° in the <0001> direction.

Here, the (11-20) plane is a plane that the (0001) plane is tilted 90° in the <11-20> direction, and the (−1-120) plane is a plane that the (000-1) plane is tilted 90° in the <11-20> direction. A (11-201 plane represents any one of the (11-20) plane and (−1-120) plane.

In this regard, a {0001} plane represents any one of the (0001) plane and the (000-1) plane.

It is known that the MOS device including silicon carbide has sufficient MOS characteristics in a case where an inversion channel layer is formed on any planes parallel to the <0001> direction. The MOS characteristics herein represent characteristics that a channel resistance is low and a threshold voltage is reduced.

The cells 20 have the grid pattern in this embodiment, so that the MOS characteristics improve when the trench side wall is formed on a {1-100} plane or the {11-20} plane parallel to the <0001> direction.

When the inversion channel layer is formed on a plane having a trench off-angle $\theta_2$ ($\theta_2>0°$) in the <0001> direction with respect to the plane parallel to the <0001> direction in the MOS device including silicon carbide, the MOS characteristics are inferior to those of the plane parallel to the <0001> direction. As the trench off-angle $\theta_2$ is greater, the MOS characteristics usually have greater deterioration.

In this embodiment, the four trench sidewall surfaces of the cell 20 in the trench MOSFET include the (1-100) plane, the (−1100) plane, the 4°-off (11-20) plane tilted the trench off-angle of 4° in the <0001> direction, and the 4°-off (−1-120) plane opposite to the 4°-off (11-20) plane.

Therefore, it is desirable that the second base region 14 is formed so as to be in contact with the off-downstream trench side wall 23 or the off-upstream trench side wall 22 being the plane tilted 4° from the {11-20} plane. The second base region 14, which leads to a significant increase in the channel resistance, is formed on the trench sidewall surface having the high channel resistance from the beginning, whereby the increase in the on-resistance of the trench MOSFET can be suppressed to a minimum.

In the part (b) of FIG. 2 in this embodiment, the second base region 14 is provided on the off-upstream trench side wall 22 being the 4°-off (11-20) plane, but the second base region 14 may be provided on the off-downstream trench side wall 23 being the 4°-off (−1-120) plane.

In other words, of the trench side wall having the four surfaces, the second base region 14 is preferably formed on the plane having the trench off-angle $\theta_2$ ($\theta_2>0°$) in the <0001> direction with respect to the plane parallel to the <0001> direction.

With the configuration as described above, the second base region 14 is formed on any of the trench side walls 24 that are the {1-100} planes having the good MOS characteristics and are parallel to the off-direction, the off-upstream trench side wall 22 being the 4°-off (11-20) plane having the slightly deteriorated MOS characteristics, the off-downstream trench side wall 23 being the 4°-off (−1-120) plane having the slightly deteriorated MOS characteristics.

According to the configuration of this embodiment, of the four surfaces of the trench side wall, the second base region 14 is not formed on the surface having the good MOS characteristics, so that a rise in the on-resistance due to the second base region 14 can be suppressed to a minimum.

Furthermore, the trench sidewall surface on which the second base region 14 is formed hardly functions as the channel region, so that the characteristics of the inversion channel layer are determined by the characteristics of the other three surfaces on which the second base region 14 is not formed. Two of the three surfaces in which the inversion channel layer is formed serve as the trench side walls 24 having the same characteristics and being parallel to the off-direction, so that variations in a gate threshold voltage and a drain current due to a plane direction can be suppressed, and a difference in channel characteristics in the ON state between the surfaces in which the inversion channel layer is formed in each of the cells 20 can be reduced. Therefore, a concentration of a current in a specific trench sidewall surface can be suppressed.

Hereinafter, a method for manufacturing the trench MOSFET shown in FIGS. 1 and 2 is described. FIGS. 4 to 13 are step diagrams. Parts (a) of FIGS. 4 to 13 each and parts (b) of FIGS. 4 to 13 each correspond to cross-sectional views of regions that each correspond to the A-A section and the B-B section in FIG. 1.

In FIG. 4, first, the epitaxial layer 2 is formed on the silicon carbide substrate 1. Here, the low-resistance silicon carbide substrate 1 of the n-type (first conductivity type) having the polytype of 4H is prepared, and the epitaxial layer 2 of the n-type (first conductivity type) is epitaxially grown on the silicon carbide substrate 1 by a chemical vapor deposition (CVD) technique. The epitaxial layer 2 has an n-type (first conductivity type) impurity concentration of $1×10^{15}$ cm$^{−3}$ to $1×10^{17}$ cm$^{−3}$ and a thickness of 5 to 50 µm.

Next, a predetermined dopant is ion-implanted into the surface of the epitaxial layer 2, to thereby form the first base region 3 of the p-type (second conductivity type) and the source region 4 of the n-type (first conductivity type). Here, the first base region 3 of the p-type (second conductivity type) is formed by ion-implanting aluminum (Al) being p-type (second conductivity type) impurities. A depth of the ion implantation of Al is approximately 0.5 to 3 µm in a range that does not exceed the thickness of the epitaxial layer 2. An impurity concentration of Al implanted is higher than the n-type (first conductivity type) impurity concentration in the epitaxial layer 2. At this time, the region of the epitaxial layer 2 at a depth deeper than the depth of the implantation of Al is the drift layer 2a. In other words, the region of the epitaxial layer 2 in which the first base region 3 of the p-type (second conductivity type) is not formed serves as the drift layer 2a.

In addition, the first base region 3 may be formed by epitaxial growth. Also in that case, the first base region 3 has the same impurity concentration and thickness as those when being formed by the ion implantation.

The source region 4 of the n-type (first conductivity type) is formed by ion-implanting nitrogen (N) being n-type (first conductivity type) impurities into the surface of the first base region 3. The source region 4 is formed in the grid pattern, as shown in FIG. 1, correspondingly to a layout of the gate electrode 7 (trench 5), which is subsequently formed. Therefore, when the gate electrode 7 is formed, the source region 4 is disposed on both sides of the gate electrode 7. A depth of the ion implantation of N is shallower than the thickness of the first base region 3. An impurity concentration of N implanted is higher than a p-type (second conductivity type) impurity concentration in the first base region 3 and in a range of $1\times10^{18}$ cm$^{-3}$ to $1\times10^{21}$ cm$^{-3}$.

Figure 5:
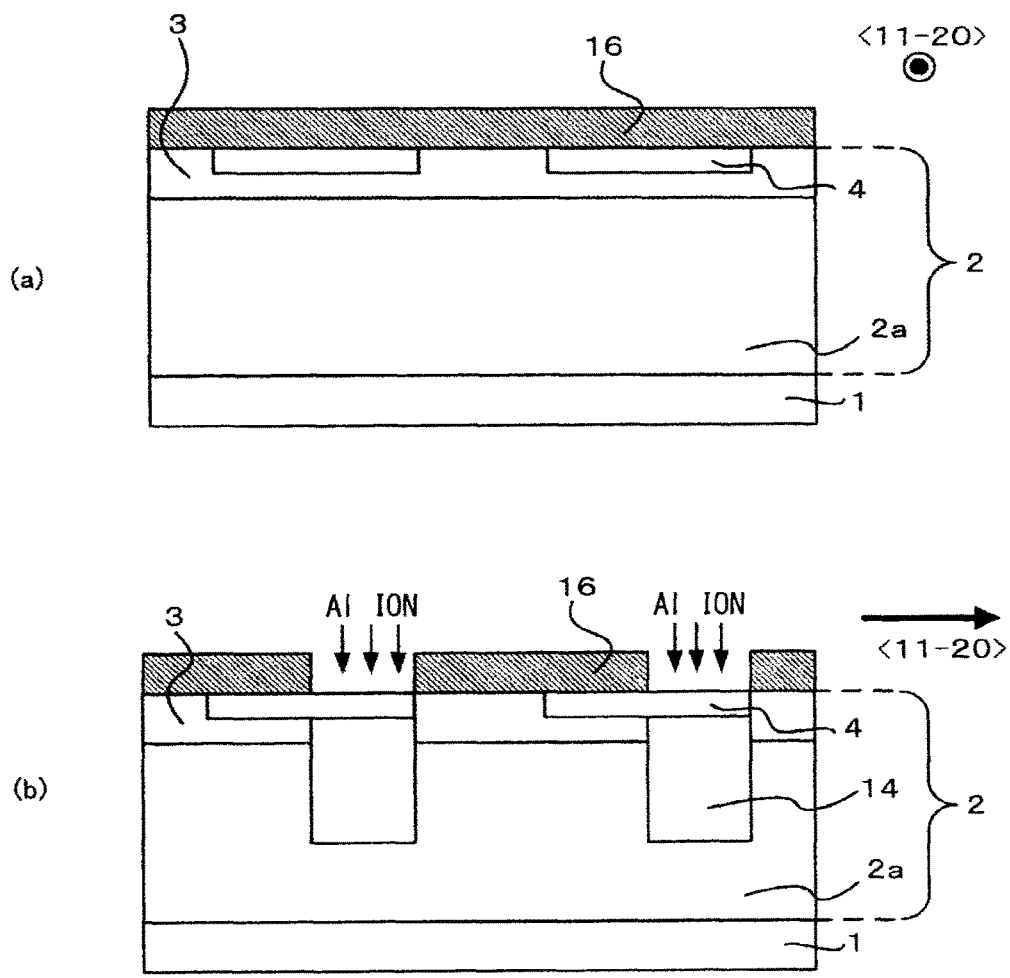
FIG. 5 is a cross-sectional view for describing the method for manufacturing the trench MOSFET according to the first embodiment of the present invention until formation of a second base region.

Next, in FIG. 5, Al being the p-type (second conductivity type) impurities is ion-implanted into the surface of the epitaxial layer 2 through a first implantation mask 16, to thereby form the second base region 14 of the p-type (second conductivity type). The second base region 14 is formed on one surface of the four surfaces of the trench side wall that is subsequently formed in the cell 20.

Figure 6:
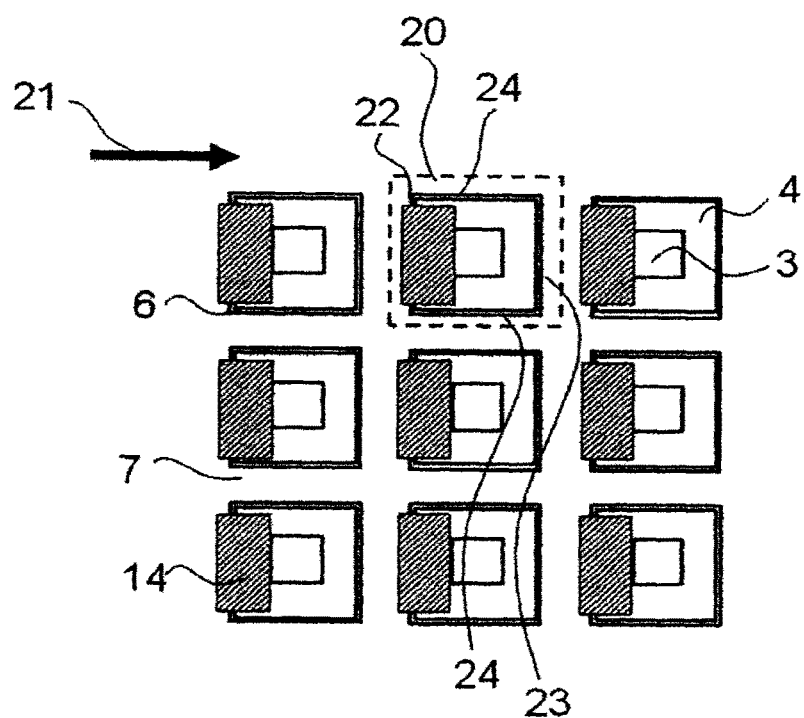
FIG. 6 is a top view for describing the method for manufacturing the trench MOSFET according to the first embodiment of the present invention.

FIG. 6 is a top view for describing the method for manufacturing the trench MOSFET according to this embodiment. In this embodiment, as shown in FIG. 6, a region in which the off-upstream trench side wall 22 of the cell 20 is formed is subjected to the ion implantation, to thereby form the second base region 14.

The second base region 14 is formed, as shown in FIG. 6, so as to stretch over the off-upstream trench side wall 22 on which the second base region 14 is formed correspondingly to the layout of the trench 5 that is subsequently formed, and the second base region 14 is formed in the grid pattern correspondingly to the positons of the cells 20. Moreover, the second base region 14 is formed to have a width of 0.3 µm or more from the off-upstream trench side wall 22 on which the second base region 14 is formed to the inside of the cell 20.

Hereinafter, a relationship between the impurity concentration of Al implanted for forming the second base region 14 and the depth of the second base region 14 and those effects is indicated. The second base region 14 has the p-type (second conductivity type) impurity concentration higher than the p-type (second conductivity type) impurity concentration in the first base region 3 and higher than the p-type (second conductivity type) impurity concentration in the protective diffusion layer 13. In this case, the second base region 14 is totally depleted before the protective diffusion layer 13 causes an avalanche upon application of high voltage in the OFF state of the trench MOSFET, whereby the connection between the protective diffusion layer 13 and the first base region 3 can be prevented from being lost.

Furthermore, the high p-type (second conductivity type) impurity concentration of the second base region 14 can reduce a resistance of the second base region 14, and thus an effect of preventing the dielectric breakdown in the gate insulating film 6 due to the displacement current when the trench MOSFET is turned off can be easily obtained. However, in a case where the second base region 14 has the high impurity concentration, a decrease in a withstand voltage of the trench MOSFET due to an avalanche caused by the second base region 14 before by the protective diffusion layer 13 needs to be prevented by forming the bottom of the second base region 14 shallower than the bottom of the protective diffusion layer 13 with respect to the surface of the epitaxial layer 2.

Therefore, it is desirable that the second base region 14 has the impurity concentration higher than that the impurity concentration in the first base region 3 and preferably higher than the impurity concentration in the protective diffusion layer 13, and it is desirable that the second base region 14 has the depth deeper than or equal to the depth of the trench 5 and shallower than or equal to the depth of the protective diffusion layer 13.

Then, as shown in FIG. 7, an etching mask having a thickness of approximately 1 to 2 µm is deposited on the surface of the epitaxial layer 2, and a resist mask 12 made of a resist material is formed thereon. The resist mask 12 is formed into a pattern in which a region for forming the trench 5 is an opening by a photolithography technology. The trenches 5 have the grid pattern, and thus the resist mask 12 has a matrix pattern inverted from the grid pattern.

Figure 8:
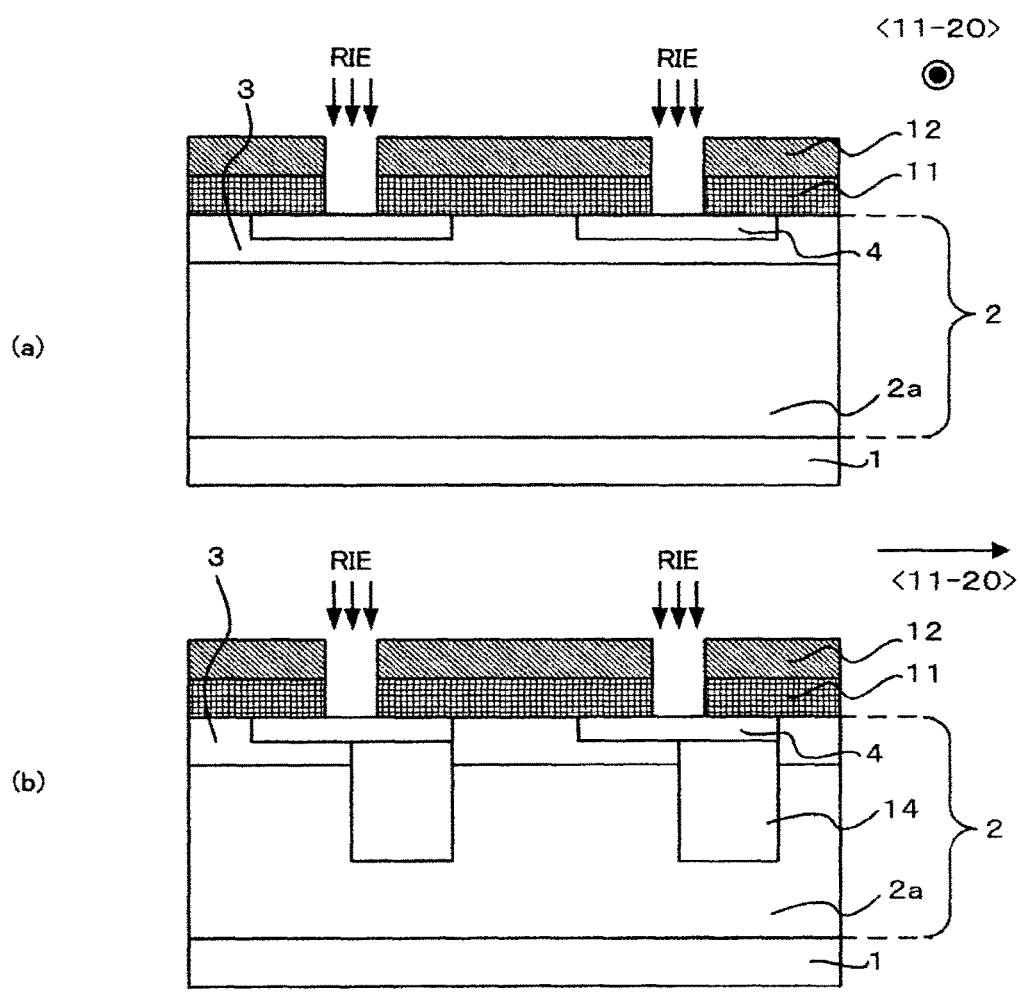
FIG. 8 is a cross-sectional view for describing the method for manufacturing the trench MOSFET according to the first embodiment of the present invention until the formation of the etching mask for the trench.

Then, in FIG. 8, the etching mask is patterned by a reactive ion etching (RIE) process in which the resist mask 12 serves as a mask. In other words, the pattern of the resist mask 12 is transferred to a silicon oxide film 11. The silicon oxide film 11 that has been patterned is a mask for a next etching step of forming the trench 5.

Figure 9:
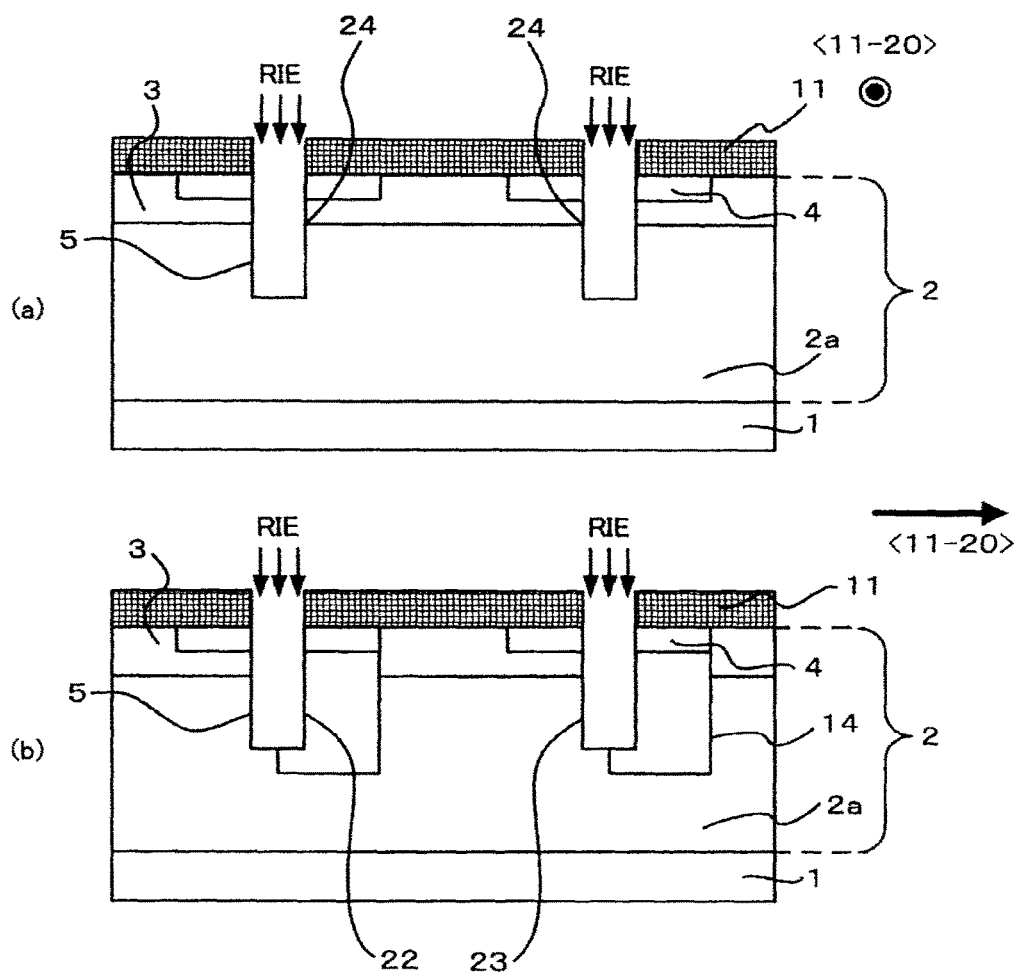
FIG. 9 is a cross-sectional view for describing the method for manufacturing the trench MOSFET according to the first embodiment of the present invention until formation of the trench.

Next, in FIG. 9, the trench 5 that penetrates the source region 4 and the first base region 3 is formed in the epitaxial layer 2 by the RIE in which the patterned etching mask serves as a mask. The trench 5 has a depth of approximately 0.5 to 3 µm deeper than or equal to the depth of the first base region 3 and shallower than or equal to the depth of the second base region 14.

Of the trench 5, the trench sidewall surfaces parallel to the off-direction 21 being the <11-20> direction shown in a part (a) of FIG. 9 are the trench side walls 24 parallel to the off-direction, and the off-upstream trench sidewall surface of the trench sidewall surfaces perpendicular to the off-direction 21 being the <11-20> direction shown in a part (b) of FIG. 9 is the off-upstream trench side wall 22 and the off-downstream trench sidewall surface thereof is the off-downstream trench side wall 23.

Subsequently, in FIG. 10, a second implantation mask 15 having the pattern (similar to that of the resist mask 12) in which the portion of the trench 5 is an opening is formed, and the protective diffusion layer 13 of the p-type (second conductivity type) is formed on the bottom of the trench 5 by an ion implantation in which the second implantation mask 15 serves as a mask. Herein, Al is used as the p-type (second conductivity type) impurities. To be connected to the second base region 14, the protective diffusion layer 13 is implanted at a depth in contact with the bottom of the second base region 14. In addition, the etching mask being patterned when the trench 5 is formed and being used as the mask for the etching may be used as it is instead of the second implantation mask 15. In this case, the etching mask used as the mask for the etching is commonly used as the implantation mask, allowing for simplified manufacturing steps and reduced costs. It should be noted that in a case where the silicon oxide film 11 is used instead of the second implantation mask 15, the thickness of the etching mask and conditions of the etching for forming the trench 5 need to be adjusted after the trench 5 is formed so as to leave the silicon oxide film 11 having the thickness to some extent.

After the second implantation mask 15 in FIG. 10 is removed, annealing that activates N and Al ion-implanted in the above-mentioned steps is performed using a heat treatment device. The annealing is performed in an inert gas atmosphere, such as argon (Ar) gas, on conditions that 1300 to 1900° C. and 30 seconds to an hour.

Figure 11:
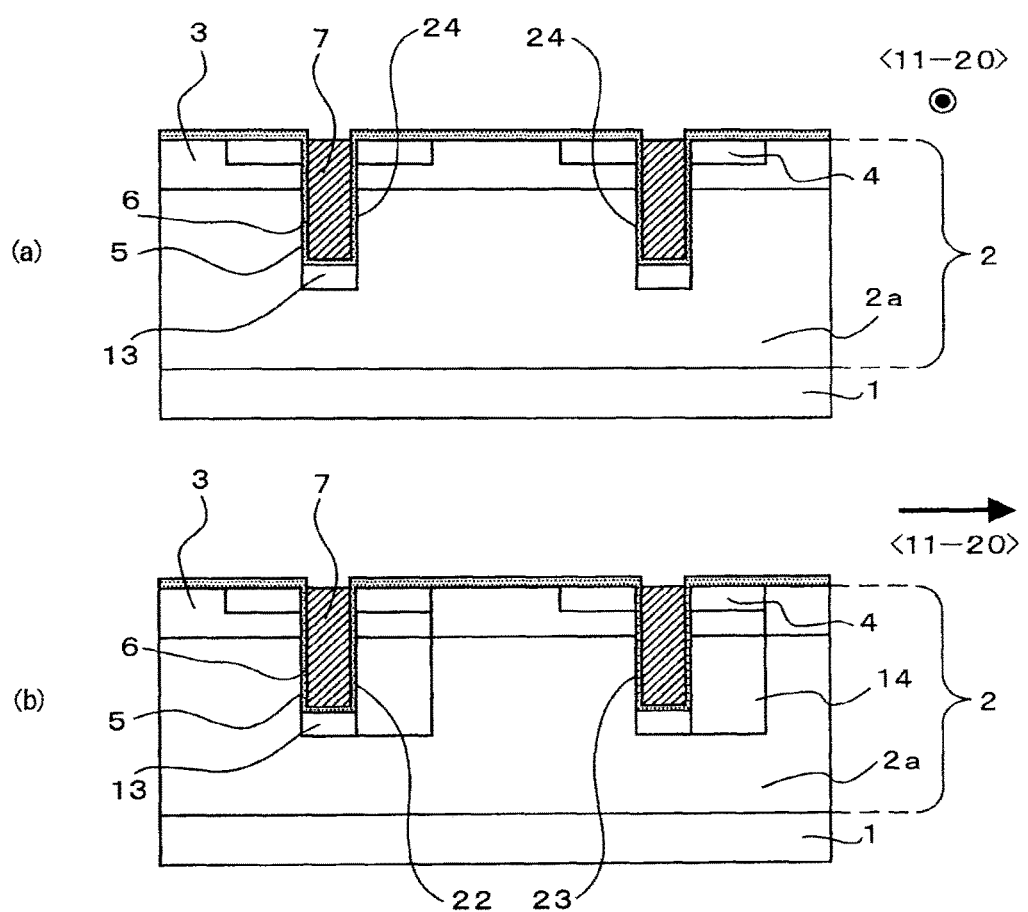
FIG. 11 is a cross-sectional view for describing the method for manufacturing the trench MOSFET according to the first embodiment of the present invention until formation of a gate insulating film.

Then, in FIG. 11, after the gate insulating film 6 is entirely formed in the epitaxial layer 2 including the inside of the trench 5, polysilicon that is to be the gate electrode 7 is deposited by a low-pressure CVD technique, and by patterning them or etching them back, the gate insulating film 6 and the gate electrode 7 are formed inside the trench 5. A silicon oxide film that is to be the gate insulating film 6 may be formed by a thermal oxidation technique performed on the epitaxial layer 2 or may be formed on the epitaxial layer 2 and inside the trench 5 by a deposition technique.

Figure 12:
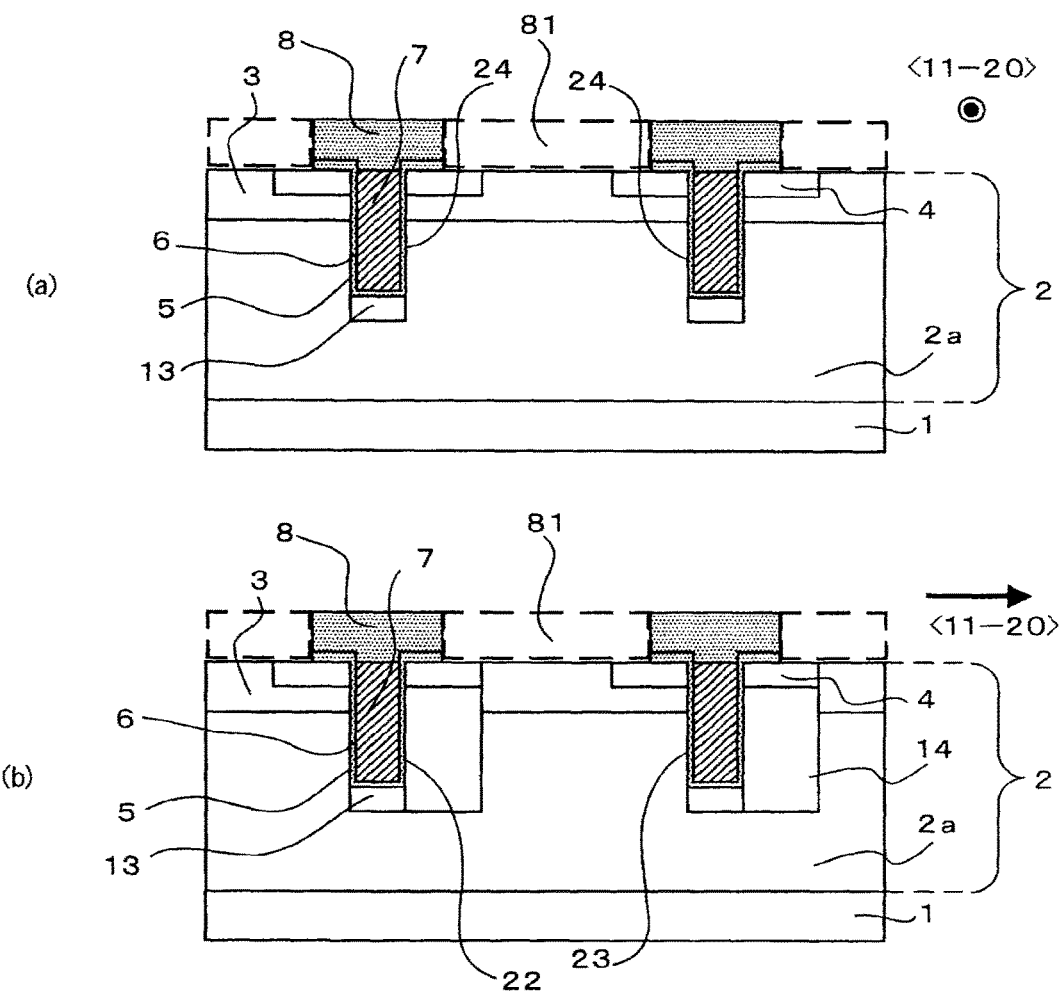
FIG. 12 is a cross-sectional view for describing the method for manufacturing the trench MOSFET according to the first embodiment of the present invention until formation of a contact hole.

Subsequently, in FIG. 12, the interlayer insulating film 8 is entirely formed on the surface of the epitaxial layer 2 by the low-pressure CVD technique, and the interlayer insulating film 8 is patterned after covering the gate electrode 7, to thereby form the contact hole 81 that reaches the source region 4 and the first base region 3. In FIG. 12, a region surrounded by a dotted line corresponds to the contact hole 81.

Figure 13:
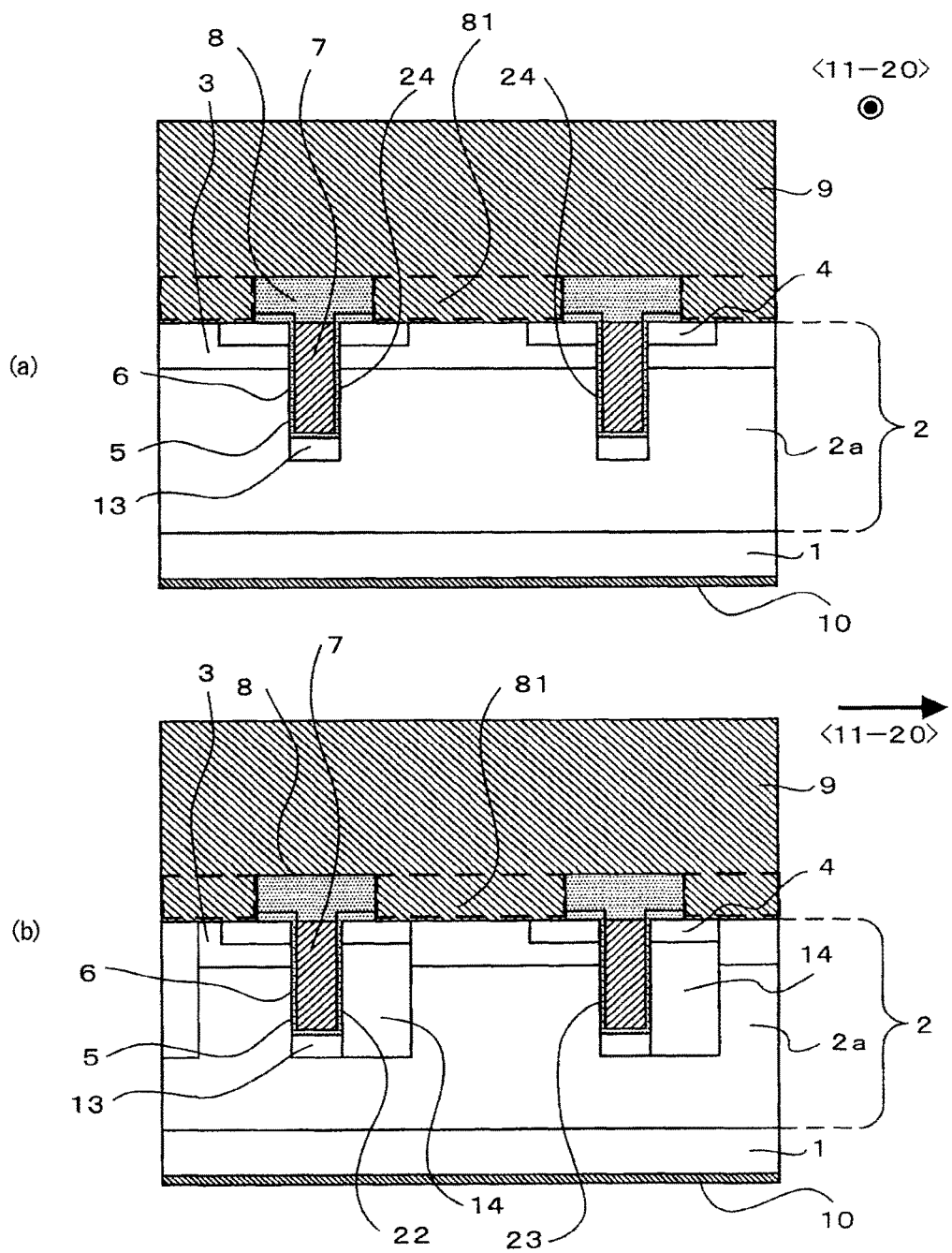
FIG. 13 is a cross-sectional view for describing the method for manufacturing the trench MOSFET according to the first embodiment of the present invention until completion.

Lastly, in FIG. 13, an electrode material such as an Al alloy is deposited on the epitaxial layer 2, to thereby form the source electrode 9 on the interlayer insulating film 8 and in the contact hole 81. Furthermore, an electrode material such as an Al alloy is disposed on the lower surface of the silicon carbide substrate 1 to form the drain electrode 10, and thus the trench MOSFET having the configuration shown in FIG. 2 is obtained.

In the trench MOSFET including silicon carbide manufactured by using this embodiment, the second base region 14 is not formed in the plane direction of the surface having the best MOS characteristics of the trench sidewall surfaces, so that the rise in the on-resistance due to the second base region 14 can be suppressed to a minimum. In other words, in the trench MOSFET according to this embodiment, the side wall having the trench off-angle $\theta_2$ of 0° that reduces the channel resistance functions as the channel and maintains the reduced channel resistance, so that the rise in the on-resistance due to the second base region 14 can be effectively suppressed.

Moreover, according to this embodiment, the second base region 14 is provided for each of the cells 20, allowing for the electrical connection between the protective diffusion layer 13 and the source electrode 9 in each of the cells 20. This can shorten the distance between the protective diffusion layer 13 and the first base region 3 and can secure a great number of connection paths between the protective diffusion layer 13 and the source electrode 9. Thus, the dielectric breakdown in the gate insulating film 6 due to the displacement current upon the turn-off can be suppressed.

Furthermore, the protective diffusion layer 13 is provided on the bottoms of the trenches 5 of all the cells 20 in the active region by using this embodiment. This can relieve an electric field in the gate insulating film 6 on the bottoms of all the trenches 5 in the active region and can suppress the dielectric breakdown in the gate insulating film 6 upon application of high voltage.

This embodiment gives the descriptions about the trench MOSFET having the structure in which the epitaxial layer 2 and the silicon carbide substrate 1 are the same first conductivity type, but this embodiment is applicable to a trench IGBT having a structure in which the epitaxial layer 2 and the silicon carbide substrate 1 are different conductivity types. For example, the epitaxial layer 2 shown in FIG. 1 is configured to be the first conductivity type being the n-type while the silicon carbide substrate 1 shown in FIG. 1 is the second conductivity type being the p-type, which serves as a configuration of the trench IGBT. In this case, the source region 4 and the source electrode 9 in the trench MOSFET respectively correspond to an emitter region and an emitter electrode in the trench IGBT, and the drain electrode 10 corresponds to a collector electrode.

Furthermore, the first conductivity type is the n-type and the second conductivity type is the p-type in this embodiment, but the first conductivity type may be the p-type and the second conductivity type may be the n-type.

In this embodiment, the plane having the off-angle with respect to the (0001) plane is used as the main surface of the silicon carbide substrate 1, but the plane having the off-angle with respect to the (000-1) plane may also be used as the main surface of the silicon carbide substrate 1. In other words, the plane having the off-angle with respect to the {0001} plane may be used as the main surface of the silicon carbide substrate 1. The {0001} plane represents any one of the (0001) plane and the (000-1) plane.

In this embodiment, the off-angle is 4°, but it suffices that the off-angle is more than 0°. The reason is that if the {0001} plane has the off-angle of more than 0°, any of the plane directions of the trench side wall has the trench off-angle $\theta_2$ in the <0001> direction with respect to the plane parallel to the <0001> direction.

In this embodiment, the epitaxial layer 2 is directly grown on the surface of the silicon carbide substrate 1, but it may be grown through a buffer layer.

In this embodiment, the two surfaces of the trench side wall are formed in the direction parallel to the off-direction 21, and the second base region 14 is not formed on the trench side walls 24 parallel to the off-direction. In this manner, it is desirable that at least one surface of the trench sidewall surfaces is parallel to the off-direction 21. The plane parallel to the off-direction 21 always has the trench off-angle $\theta_2$ of 0°, so that the channel region can be formed in the plane that has the sufficient MOS characteristics and is parallel to the <0001> direction.

In this embodiment, the gate electrode 7 is disposed in the cells 20 in the grid pattern, but even if the cells are disposed differently, the effects of the present invention can be obtained as long as the trench side wall includes a plurality of surfaces.

In other words, even if the cells 20 do not have the grid pattern, a surface having the off-angle with respect to the {0001} plane is used as the main surface of the silicon carbide substrate 1, causing at least one surface of the plurality of surfaces of the trench side wall to be a surface having the trench off-angle $\theta_2$ with respect to the plane parallel to the <0001> direction. This surface has the MOS characteristics inferior to those of the plane parallel to the <0001> direction, and thus the effects of this embodiment are obtained if the second base region 14 is formed on the trench sidewall surface in the plane direction having the trench off-angle $\theta_2$ with respect to the plane parallel to the <0001> direction.

Furthermore, in the first embodiment, the off-direction 21 of the silicon carbide substrate 1 is the <11-20> direction, but it may be any directions parallel to the {0001} plane, such as the <1-100> direction.

Second Embodiment

FIG. 14 is a schematic diagram showing relationships of angles between a main surface of a silicon carbide substrate 1 and trench sidewall surfaces in an insulated gate silicon carbide semiconductor device having a trench-gate structure according to a second embodiment of the present invention. The second embodiment is characterized in that a second base region 14 is formed on a surface having the largest trench off-angle $\theta_2$ in a case where, for example, the trench side wall tapers down. It is similar to the first embodiment except for this. According to this embodiment, in a case where trench off-angles $\theta_2$ differ according to a plane direction of the trench side wall, such as the case where the trench side wall tapers down, the second base region 14 is formed on a surface having the largest trench off-angle $\theta_2$, namely, a surface having the greatest channel resistance, in order to form a trench MOSFET capable of suppressing a rise in on-resistance to a minimum.

FIG. 14 is the diagram, which corresponds to FIG. 3 in the first embodiment, schematically showing the relationships of the angles between the main surface of the silicon carbide substrate 1 and the trench sidewall surfaces in a case where the trench side wall has a taper angle $\theta_4$ in the second embodiment. As shown in FIG. 14, in the second embodiment, the trench side wall tapers such that a width of the trench increases from the bottom to the top.

A part (a) of FIG. 14 is a diagram schematically showing that the trench side walls 24 parallel to the off-direction in the part (a) of FIG. 3 have taper angles $\theta_4$.

A part (b) of FIG. 14 is a diagram schematically showing that the trench side walls perpendicular to the off-direction in the part (b) of FIG. 3 have taper angles θ4.

As described in the manufacturing method in the first embodiment, when the trench 5 is formed by etching, some processes may cause a taper having a taper angle $\theta_4$ of few degrees even if a target angle is 90° with respect to the epitaxial layer 2. As shown in FIG. 14, in this embodiment, the taper angles $\theta_4$ occur in the surfaces having the angles of 90° with respect to the epitaxial layer 2.

The trench side walls 24 parallel to the off-direction in the part (a) of FIG. have {1-100} planes having trench off-angles $\theta_2$ being equal to the taper angles $\theta_4$ provided by the taper angles $\theta_4$.

The off-upstream trench side wall 22 in the part (b) of FIG. 14 has the (0001) plane having a trench off-angle $\theta_2$ of degrees of (86°−$\theta_4$) provided by the taper angle $\theta_4$. Furthermore, the off-downstream trench side wall 23 has the (000-1) plane having a trench off-angle $\theta_2$ of degrees of (86°+$\theta_4$) provided by the taper angle $\theta_4$.

In other words, the off-upstream trench side wall 22 has the (11-20) plane tilted (4°+$\theta_4$) in the <0001> direction, so that a trench off-angle $\theta_2$ is (4°+$\theta_4$). The off-downstream trench side wall 23 has the (−1-120) plane tilted (4°−$\theta_4$) in the <0001> direction, so that a trench off-angle $\theta_2$ is (4°−$\theta_4$).

In the case where the trench side wall has the taper angles $\theta_4$, the plane directions of the trench side wall are the {1-100} planes having the trench off-angles $\theta_2$ equal to the taper angles $\theta_4$ and the {11-20} planes having the trench off-angles $\theta_2$ equal to the (4°±$\theta_4$).

Here, the off-upstream trench side wall 22 that has the largest trench off-angle $\theta_2$ and is the {−1-120} plane with (4°+$\theta_4$)-off has the worst MOS characteristics. Thus, in this embodiment, the second base region 14 is preferably provided on the off-upstream trench side wall 22.

In other words, when the plurality of surfaces of the trench side wall exhibit the plane directions having the different trench off-angles $\theta_2$ by tapers or the like, the second base region 14 is provided on the surface having the largest trench off-angle $\theta_4$.

In this embodiment, in the case where the plurality of surfaces of the trench side wall have the different MOS characteristics due to the different trench off-angles $\theta_2$, the second base region 14 is formed on the surface having the worst MOS characteristics, whereby the increase in on-resistance of the trench MOSFET can be suppressed to a minimum.

This embodiment gives the descriptions about the tapered trench 5, and it is needless to say that this embodiment can be similarly performed in a case where the trench side wall has a plurality of surfaces having different MOS characteristics due to different trench off-angles $\theta_2$ resulting from a structure of the cell 20 and the off-direction 21 except for the taper.

In addition, the second embodiment of the present invention gives the descriptions about the differences between this embodiment and the first embodiment of the present invention and omits the descriptions about the same or corresponding portions.

Third Embodiment

Figure 15:
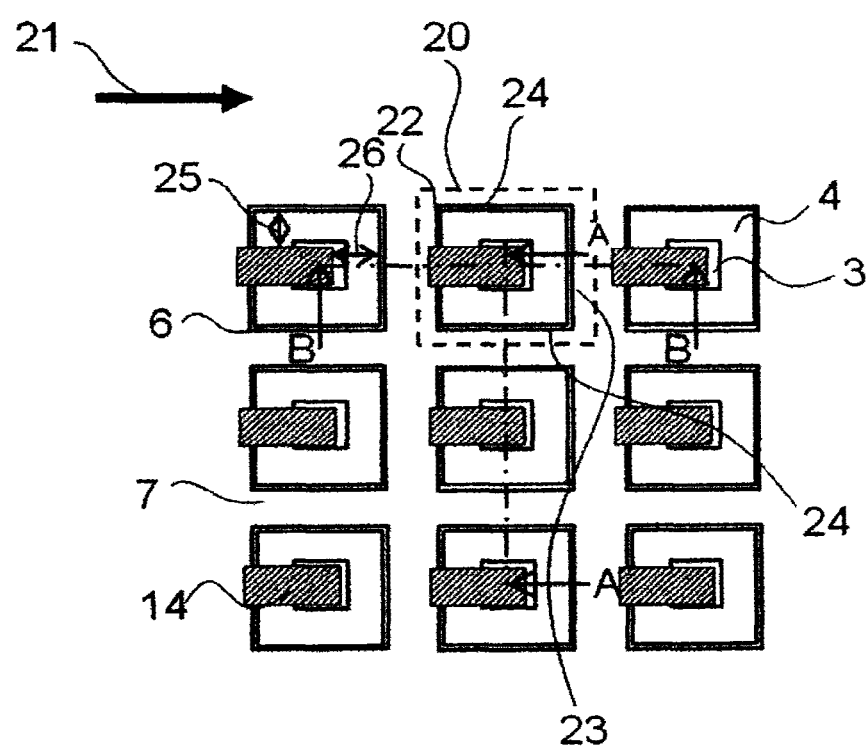
FIG. 15 is a top view showing part of a trench MOSFET according to a third embodiment of the present invention.

FIG. 15 is a top view, seen from the top, of part of an insulated gate silicon carbide semiconductor device having a trench-gate structure according to a third embodiment of the present invention. FIG. 15 in the third embodiment is a modification of FIG. 6 in the first embodiment and modifies a region in which the second base region 14 in FIG. 6 is formed. It is similar to the first embodiment except for this. In this embodiment, an electric field applied to the gate insulating film 6 can be more relieved.

A second base region 14 in FIG. 15 is shortened along the sidewall surface of the off-upstream trench side wall 22 and extends toward the inside of the cell 20, compared to the second base region 14 shown in FIG. 6.

In this manner, a depletion layer extending from the second base region 14 can relieve the electric field applied to the gate insulating film 6 of the trench sidewall surfaces on which the second base region 14 is not formed.

As shown in FIG. 15, the second base region 14 is formed on the off-upstream trench side wall 22, and the second base region 14 extends toward the inside of the cell 20, increasing the effect of relieving the electric field applied to the gate insulating film 6 by the depletion layer extending from the second base region 14 in an OFF state of the trench MOSFET, the gate insulating film 6 being formed on the off-downstream trench side wall 23 and the trench side walls 24 parallel to the off-direction. This effect results from the second base region 14 approaching the off-downstream trench side wall 23 and from an increase in the region of the trench side walls 24 close to the second base region 14, the trench side walls 24 being parallel to the off-direction.

Here, a distance from the second base region 14 shown in FIG. 15 to the trench side wall 24 parallel to the off-direction is a first distance 25, and a distance from the second base region 14 to the off-downstream trench side wall 23 is a second distance 26.

Figure 16:
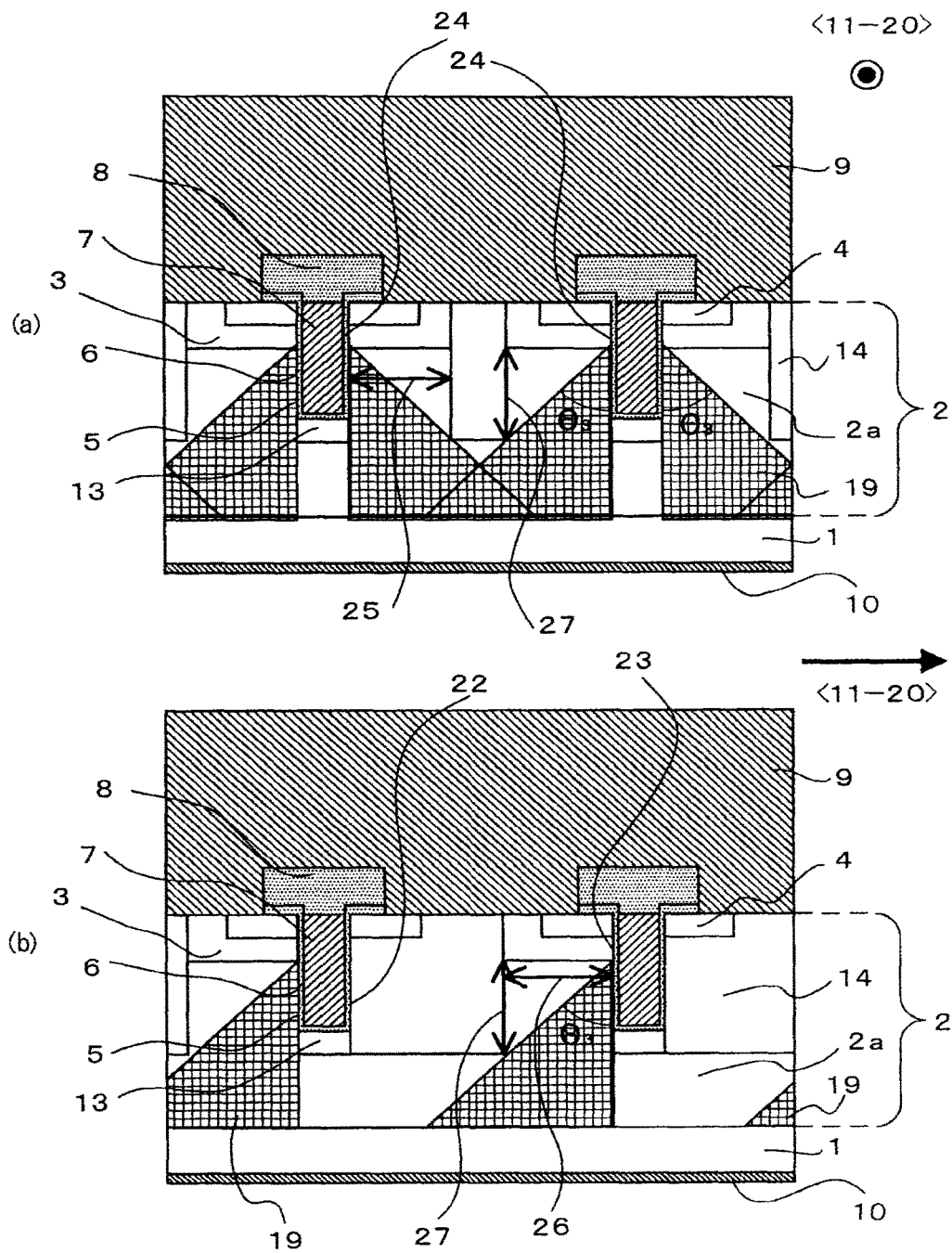
FIG. 16 is a cross-sectional view for describing a path through which electrons flow in an ON state of the trench MOSFET according to the third embodiment of the present invention.

An A-A cross-sectional view in FIG. 15 is a part (a) of FIG. 16 and a B-B cross-sectional view in FIG. 15 is a part (b) of FIG. 16. The part (b) of FIG. 16 shows that the channel region is not formed in the off-upstream trench side wall 22 on which the second base region 14 is formed. In the cross-sectional views in FIG. 16, when the trench MOSFET in an ON state, electrons implanted into the drift layer 2a from the channel region flow to the drain electrode 10 while spreading horizontally in the drift layer 2a. As shown in FIG. 16, an angle at which the electrons spread with respect to a vertical direction (direction from top to bottom) of a flow from the channel region to the drain electrode 10 is a spread angle $\theta_3$. For example, in a case where a first impurity concentration in the drift layer 2a is almost fixed, the spread angle $\theta_3$ is 40 to 50 degrees. When the electrons flow through the drift layer 2a, a path 19 through which the electrons flow is a region shown in FIG. 16. If the second base region 14 is in the path 19 through which the electrons flow at the spread angle $\theta_3$, the second base region 14 hampers the flow of the electrons and an effective volume in which the electrons flow decreases, thereby leading to the increase in the on-resistance.

Here, a distance from the bottom of the first base region 3 to the bottom of the second base region 14 is a third distance 27.

The first distance 25 in FIG. 15 and the part (a) of 16 is preferably more than or equal to (third distance 27)×(tan θ3). In a case where the first distance 25 is less than (third distance 27)×(tan θ3), the second base region 14 is formed so as to hamper the path 19 through which the electrons flow, thereby increasing the on-resistance.

An excessive increase in the first distance 25 increases a resistance of the second base region 14, resulting in a problem that an influence of a voltage drop due to a displacement current easily breaks the gate insulating film 6. Therefore, when the first distance 25 is equal to (third distance 27)×(tan $θ_3$), the rise in the on-resistance is prevented, whereby the greatest effect of increasing reliability of the gate insulating film 6 is obtained.

Further, the second distance 26 in FIG. 15 and the part (b) of 16 is preferably more than or equal to (third distance 27)×(tan θ3). In a case where the second distance 26 is less than or equal to (third distance 27)× (tan θ3), the second base region 14 is formed so as to hamper the path 19 through which the electrons flow, thereby increasing the on-resistance.

However, an excessive increase in the second distance 26 increases a resistance of the second base region 14, resulting in a problem that an influence of a voltage drop due to a displacement current easily breaks the gate insulating film 6. Therefore, when the second distance 26 is equal to (third distance 27)×(tan $θ_3$), the rise in the on-resistance is prevented, whereby the greatest effect of increasing reliability of the gate insulating film 6 is obtained.

In addition, the third embodiment of the present invention gives the descriptions about the differences between this embodiment and the first embodiment or the second embodiment of the present invention and omits the descriptions about the same or corresponding portions.

Fourth Embodiment

Figure 17:
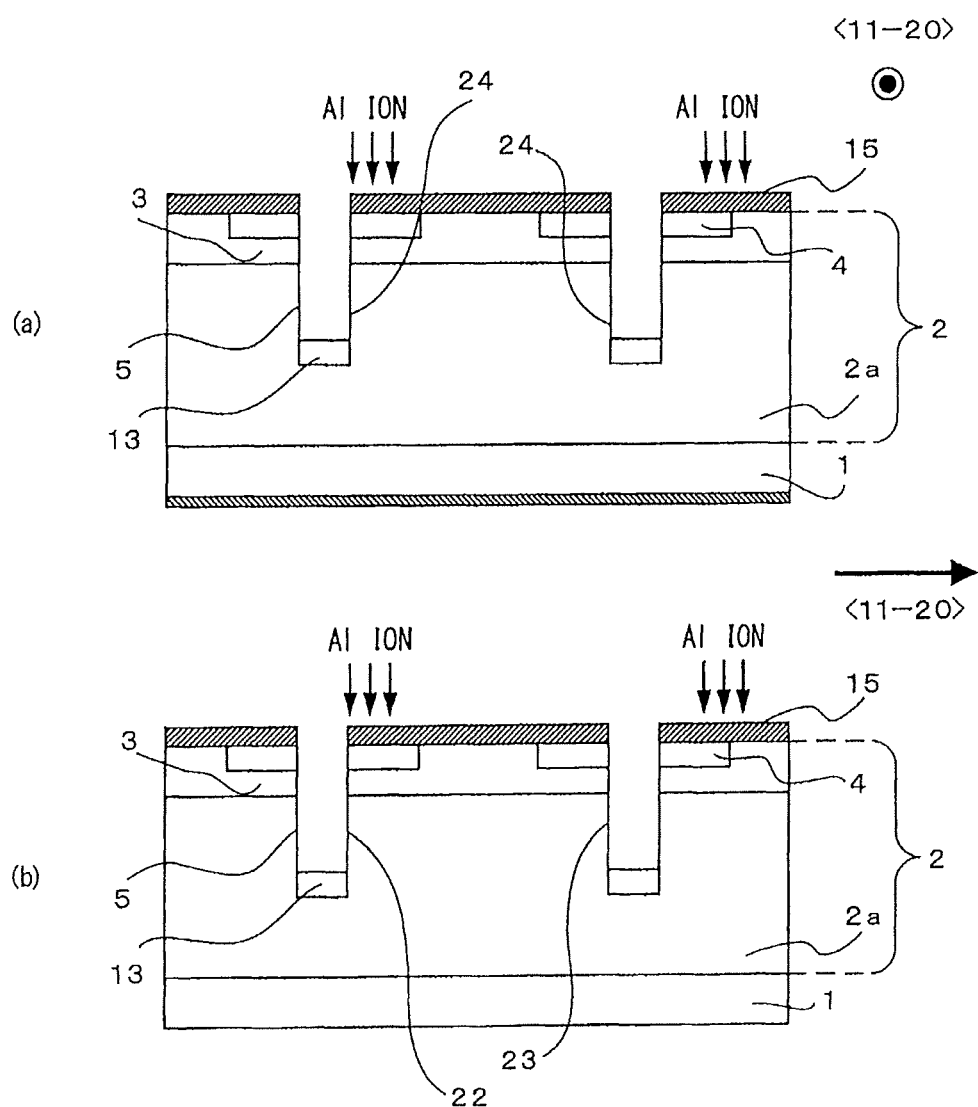
FIG. 17 is a cross-sectional view for describing formation of a protective diffusion layer in a method for manufacturing a trench MOSFET according to a fourth embodiment of the present invention.
Figure 18:
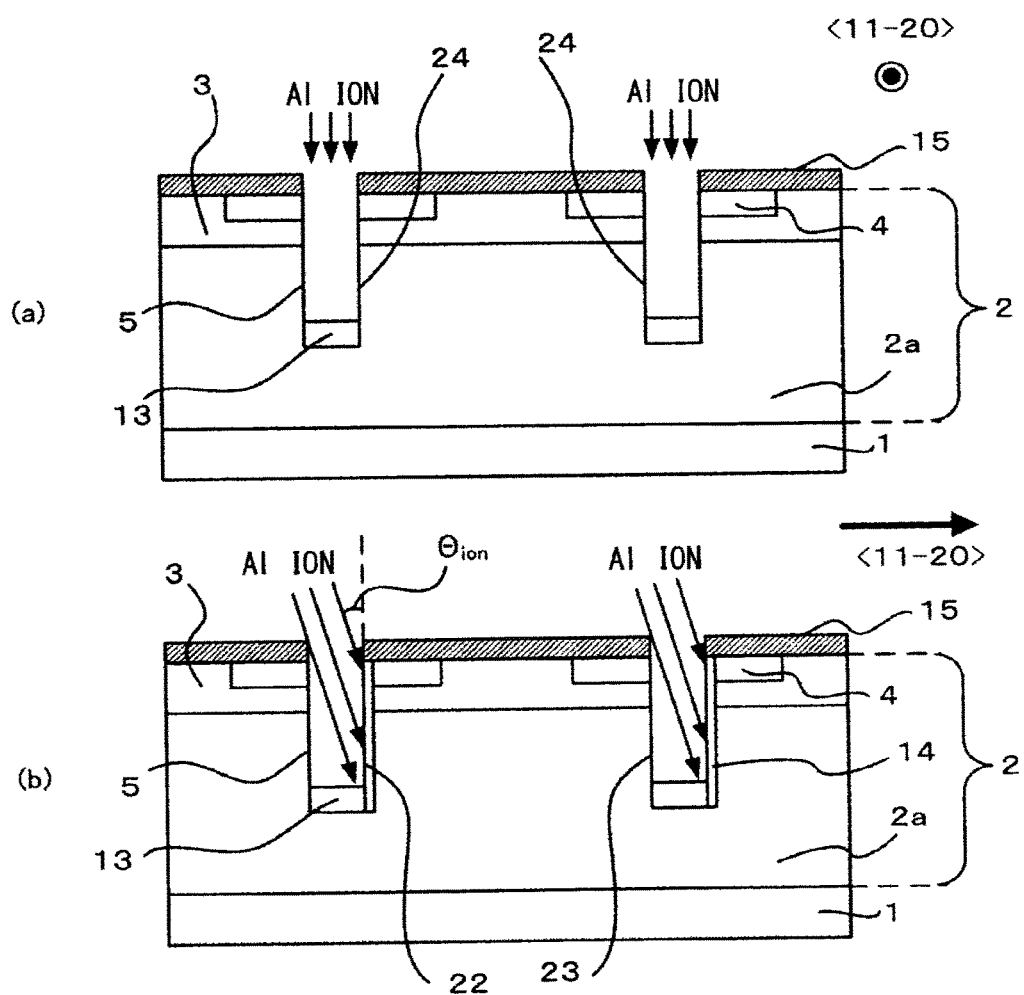
FIG. 18 is a cross-sectional view for describing formation of a second base region in the method for manufacturing the trench MOSFET according to the fourth embodiment of the present invention.

FIGS. 17 and 18 are cross-sectional views showing part of a method for manufacturing an insulated gate silicon carbide semiconductor device having a trench-gate structure according to a fourth embodiment of the present invention. The fourth embodiment is characterized in that a second base region 14 is formed by an oblique ion implantation. It is similar to the first to third embodiments except for this. A cost of manufacturing a trench MOSFET can be reduced by using this embodiment.

FIGS. 17 and 18 show sections of the part of the method for manufacturing the trench MOSFET in the fourth embodiment. FIG. 17 is the diagram for describing the process of forming, by the ion implantation, the protective diffusion layer 13 of the second conductivity type (p-type) described in FIG. 10 in the first embodiment. In addition, the implantation of the second base region 14 in FIG. 5 in the first embodiment is not performed in this embodiment. After the protective diffusion layer 13 is formed in FIG. 17, Al is obliquely ion-implanted by using the same first implantation mask 16 in FIG. 18, to thereby form the second base region 14 of the p-type on the off-upstream trench side wall 22.

As shown in FIG. 18, the oblique ion implantation is obliquely performed at an angle $θ_{ion}$ with respect to the <11-20> direction being the off-direction 21. In this manner, the Al ion is not implanted into the trench side walls 24 parallel to the off-direction shown in a part (a) of FIG. 18, and the Al ion is implanted into only the off-upstream trench side wall 22 shown in a part (b) of FIG. 18. In the part (b) of FIG. 18, the Al ion is implanted into only the off-upstream trench side wall 22, but the oblique implantation may be performed such that the Al ion is implanted into only the off-downstream trench side wall 23.

Here, the angle $θ_{ion}$ of the ion implantation is an angle between the direction perpendicular to the surface of the epitaxial layer 2 and the direction of the ion implantation. The angle $θ_{ion}$ of the ion implantation is 0°, which corresponds to the first embodiment. The angle $θ_{ion}$ of the ion implantation is less than or equal to an angle on the condition that tan $θ_{ion}$ (opening width of the trench 5)/ (thickness of the implantation mask 15+depth of the trench 5), whereby the second base region 14 of the p-type can be formed on the off-upstream trench side wall 22.

If it falls outside this range, the Al ion is not implanted into the protective diffusion layer 13, and thus the second base region 14 is not connected to the protective diffusion layer 13.

The same implantation mask for forming the protective diffusion layer 13 can be used for performing the implantation of the second base region 14 by using this embodiment, allowing for the reduced steps of manufacturing the implantation mask and an omission of the process. Further, patterning alignment is not needed for manufacturing the implantation mask twice, so that a problem of a displacement upon the patterning alignment does not occur.

This embodiment eliminates the need to perform a high-energy implantation for forming the second base region 14. In other words, the implantation into the off-upstream trench side wall 22 is performed from the trench sidewall surface, and thus the implantation depth may be shallower than that in the first embodiment, allowing for reduced implantation time and also a reduced film thickness of the implantation mask, which simplifies the process.

In addition, the fourth embodiment of the present invention gives the descriptions about the differences between this embodiment and the first to third embodiments of the present invention and omits the descriptions about the same or corresponding portions.

Fifth Embodiment

Figure 19:
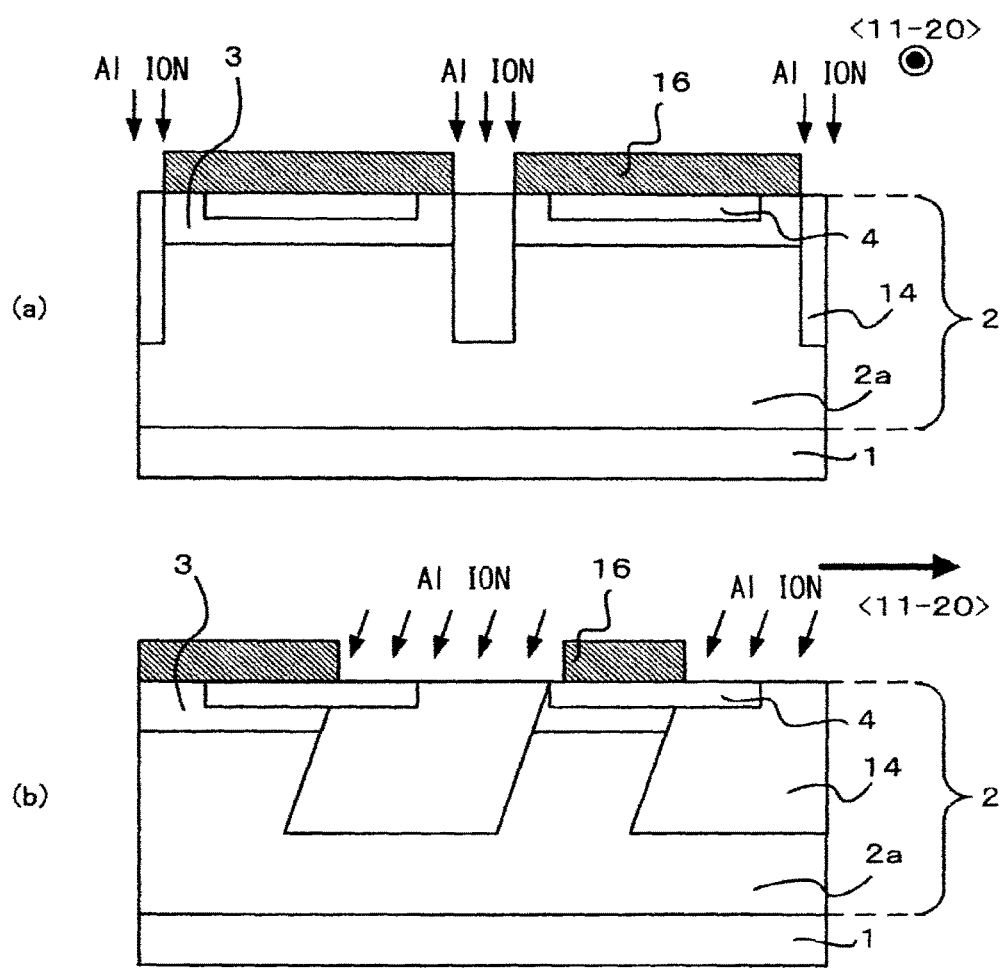
FIG. 19 is a cross-sectional view for describing formation of a second base region in a method for manufacturing a trench MOSFET according to a fifth embodiment of the present invention.

FIG. 19 is a cross-sectional view showing part of a method for manufacturing an insulated gate silicon carbide semiconductor device having a trench-gate structure according to a fifth embodiment of the present invention. The fifth embodiment is characterized in that an oblique ion implantation is performed when the second base region 14 is formed in the first to third embodiments. It is similar to the first to third embodiments except for this. A trench MOSFET in which on-resistance is lower and reliability of the gate insulating film 6 is higher can be obtained by using this embodiment.

In the trench MOSFET in the fifth embodiment, the oblique ion implantation is obliquely performed with respect to the off-direction 21 being the <11-20> direction as shown in FIG. 19 upon the implantation of the second base region 14 described in FIG. 5 in the first embodiment. In addition, a part (a) of FIG. 19 corresponds to the A-A cross-sectional view in FIG. 15, and a part (b) of FIG. 19 corresponds to the B-B cross-sectional view in FIG. 15.

Figure 20:
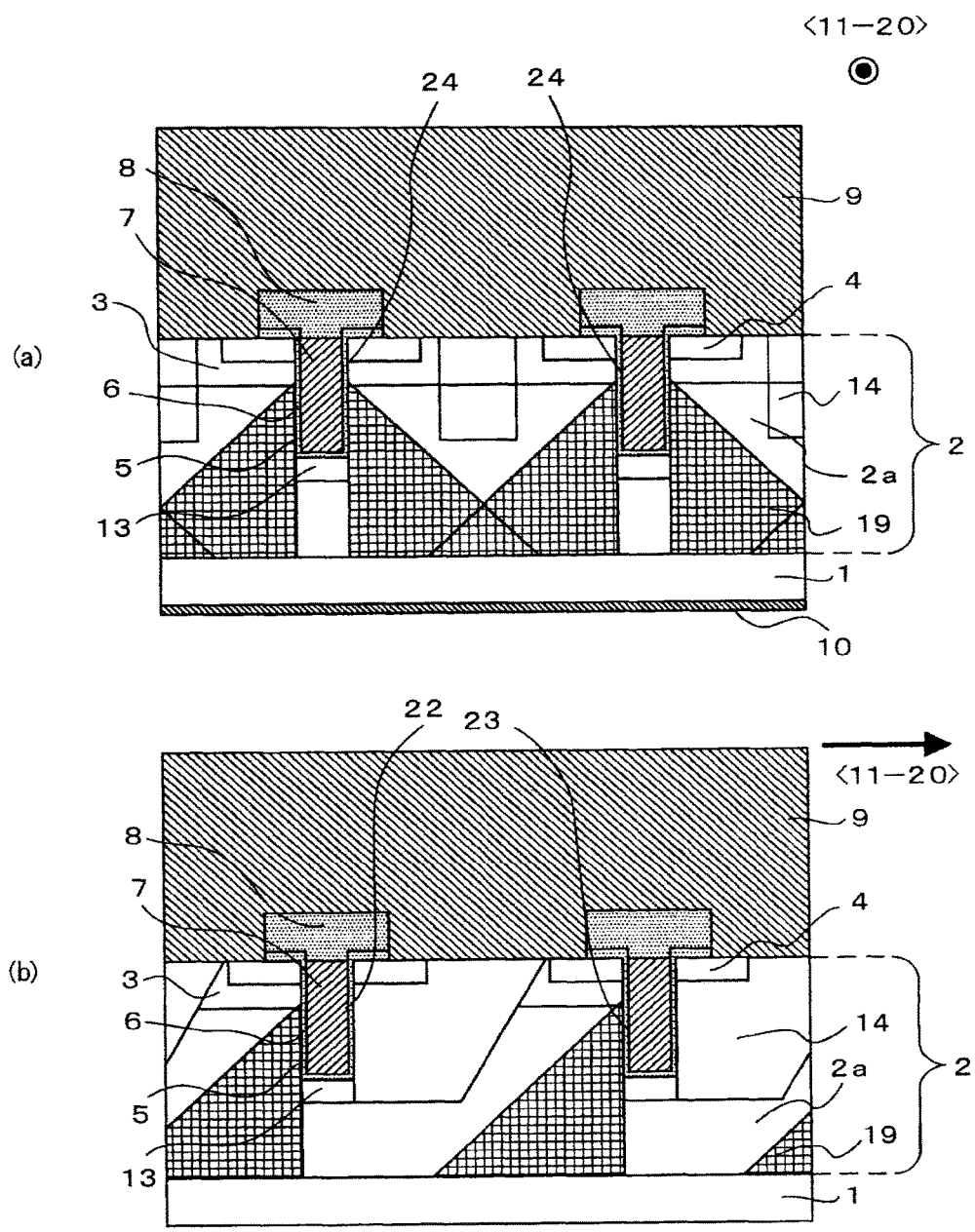
FIG. 20 is a cross-sectional view for describing a path through which electrons flow in an ON state of the trench MOSFET according to the fifth embodiment of the present invention.

FIG. 20 shows a cross-sectional view of the trench MOSFET in an ON state, the trench MOSFET being manufactured by using this embodiment. It is clear that this embodiment makes it harder to hamper the path 19 through which the electrons flow. In this embodiment, the second base region 14 is formed on the off-upstream trench side wall 22, and a side of the second base region 14 is tilted to the same direction as the path 19 through which the electrons flow, the side being opposite to the off-upstream trench side wall 22.

Therefore, according to this embodiment, the second base region 14 can be brought closer to the off-downstream trench side wall 23 in the cell 20 on the surface side of the second base region 14, whereby an increase in the on-resistance can be suppressed while the electric field of the gate insulating film 6 can be more relieved.

In addition, the fifth embodiment of the present invention gives the descriptions about the differences between this embodiment and the first to third embodiments of the present invention and omits the descriptions about the same or corresponding portions.

Sixth Embodiment

Figure 21:
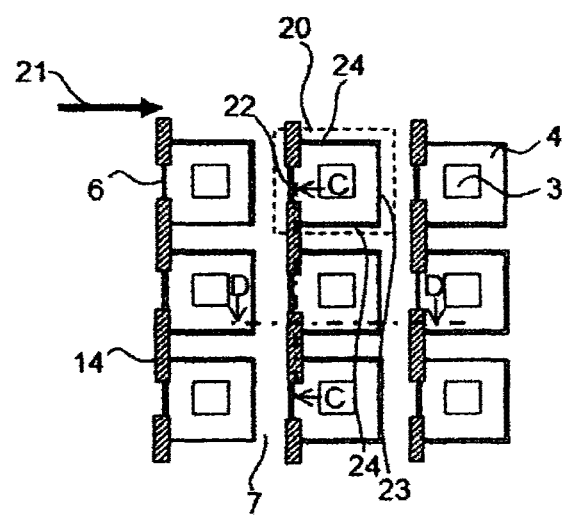
FIG. 21 is a top view showing part of a trench MOSFET according to a sixth embodiment of the present invention.

FIG. 21 is a top view showing part of an insulated gate silicon carbide semiconductor device having a trench-gate structure according to a sixth embodiment of the present invention. The sixth embodiment is characterized in that a second base region 14 is provided in a position of an end in a top view of a trench sidewall surface having a trench off-angle of more than 0°. It is similar to the first to fifth embodiments except for this. The trench MOSFET having a small malfunction can be obtained by using this embodiment.

The second base region 14 shown in FIG. 21 is different from the second base region 14 shown in FIG. 6 in the first embodiment in that the second base region 14 in FIG. 21 is provided at the end of the off-upstream trench side wall 22 corresponding to a position of a corner of the cell 20. It is clear from the top view in FIG. 21 that a corner of the trench 5 corresponds to the end of each of the trench side walls. In other words, in FIG. 21, the second base region 14 is provided in a position at an intersection of the trenches 5 being a contact between the adjacent cells. In addition, the second base region 14 is provided so as to stretch over the adjacent cells in this embodiment.

FIG. 22 shows a cross-sectional view of the insulated gate silicon carbide semiconductor device according to the sixth embodiment of the present invention. A part (a) of FIG. 22 corresponds to a C-C cross-sectional view in FIG. 21, and a part (b) of FIG. 22 corresponds to a D-D cross-sectional view in FIG. 21.

FIG. 23 shows characteristics of a drain current with respect to a gate voltage for describing effects of the insulated gate silicon carbide semiconductor device having the trench-gate structure according to the sixth embodiment. In FIG. 23, a characteristic in a case where this embodiment is used is shown by a solid line, and a characteristic in a conventional way without using this embodiment is shown by a dotted line. Upon application of a gate voltage, an electric field is concentrated in the position being the corner of the trench 5 in a top view, so that an inversion channel layer is formed at a lower gate voltage in the trench sidewall portion of the corner in comparison with the trench sidewall portions except for the corner, and an ON-state current flows at a lower gate voltage in comparison with the portions except for the corner. In other words, even if the same gate voltage is applied, a gate electric field substantially applied is different between the end of the trench side wall and the portions except for the end thereof. In this manner, as a result of starting to pass the ON-state current at the low gate voltage through the end of the trench side wall, a bump (peak) occurs in a rising part of a drain current, as the characteristic shown by the dotted line in FIG. 23. The greater peak is more likely to cause a malfunction, which is not preferable.

In this embodiment, the second base region 14 is formed on the end of the off-upstream trench side wall 22 through which the ON-state current starts to flow early, whereby the flow of the ON-state current through the region in which the second base region 14 is formed can be suppressed, and an occurrence of the peak of the drain current, which is the cause of a malfunction, can be suppressed.

When the second base region 14 is formed on the end of the off-upstream trench side wall 22 as in this embodiment, the second base region 14 has the thickness in the off-direction 21 as in the top view in FIG. 21, possibly leading to the formation of the second base region 14 on the ends of the trench side walls 24 parallel to the off-direction. As a result, in the cross-sectional view in the part (a) of FIG. 22, the second base region 14 is formed on the trench side walls 24 parallel to the off-direction.

The trench side walls 24 parallel to the off-direction have the plane direction sufficient for the channel characteristics, and thus it is not desirable that the channel region is reduced by forming the second base region 14. Therefore, the thickness of the second base region 14 in the off-direction 21 is preferably thin such that the second base region 14 is formed as little as possible on the trench side walls 24 parallel to the off-direction.

For example, as shown in FIG. 14, when the trench 5 has the taper angles $\theta_4$, the second base region 14 is also formed on the trench side walls 24 that have the trench off-angles $\theta_2$ equal to the taper angles $\theta_4$ and are parallel to the off-direction. Also in this case, the second base region 14 formed on the end of the off-upstream trench side wall 22 having the largest trench off-angle $\theta_2$ is made greater than the second base region 14 formed on the trench side walls 24 parallel to the off-direction. In this case, the second base region 14 is not formed on the off-downstream trench side wall 23 having the smallest trench off-angle $\theta_2$, which can also more suppress the increase in the on-resistance.

In this embodiment, the effect of suppressing the increase in the on-resistance by the second base region 14 is obtained while a malfunction can be suppressed.

Further, the most electric field is applied to the corner of the cell 20 also upon an OFF operation of the trench MOSFET. By using this embodiment, an electric field is relieved in the side wall of the trench 5 in the position corresponding to the corner of the cell 20 on which the second base region 14 is provided, whereby the effect of further improving the reliability of the gate insulating film 6 is also obtained.

In addition, the sixth embodiment of the present invention gives the descriptions about the differences between this embodiment and the first to fifth embodiments and omits the descriptions about the same or corresponding portions.

DESCRIPTION OF NUMERALS 1 silicon carbide substrate; 2 epitaxial layer; 2a drift layer; 3 first base region; 4 source region; 5 trench; 6 gate insulating film; 7 gate electrode; 8 interlayer insulating film; 9 source electrode; 10 drain electrode; 11 etching mask; 12 resist mask; 13 protective diffusion layer; 14 second base region; 15 second implantation mask; 16 first implantation mask; 20 cell; 21 off-direction; 22 off-upstream trench side wall; 23 off-downstream trench side wall; 24 trench side wall parallel to off-direction; 25 first distance; 26 second distance; 27 third distance; 81 contact hole.

The invention claimed is:

1. An insulated gate silicon carbide semiconductor device, comprising:
    a silicon carbide substrate of 4H type having a main surface having an off-angle of more than 0° in an off-direction with respect to a {0001} plane;
    a drift layer of a first conductivity type provided on said silicon carbide substrate;
    a first base region of a second conductivity type located on a surface side of said drift layer;
    a source region of the first conductivity type located in said first base region;
    a trench provided so as to be in contact with said source region and to reach a portion of said drift layer beneath said first base region, and having a plurality of trench sidewall surfaces;
    a gate insulating film formed in said trench;
    a gate electrode buried in said trench through said gate insulating film;
    a protective diffusion layer of the second conductivity type provided in said drift layer while being in contact with a bottom of said trench; and
    a second base region of the second conductivity type provided in said drift layer while being in contact with said protective diffusion layer, said first base region, and at least-part of at least one of said plurality of trench sidewall surfaces, said second base region having a bottom surface whose depth is equal to a bottom surface of said protective diffusion layer.

2. The insulated gate silicon carbide semiconductor device according to claim 1,
    wherein at least a different one of said plurality of trench sidewall surfaces facing said at least one of said plurality of trench sidewall surfaces provided with said second base region is not provided with said second base region.

3. The insulated gate silicon carbide semiconductor device according to claim 1,
    wherein said plurality of trench sidewall surfaces include an off-upstream trench sidewall surface positioned upstream in said off-direction, and an off-downstream trench sidewall surface positioned downstream of said off-upstream trench sidewall surface in said off-direction, and
    said second base region is provided in contact with said off-upstream trench sidewall surface.

4. The insulated gate silicon carbide semiconductor device according to claim 1,
    wherein said second base region is higher in impurity concentration of the second conductivity type than said first base region.

5. The insulated gate silicon carbide semiconductor device according to claim 1,
    wherein said trench tapers such that a width of said trench increases from said bottom to a top of said trench.

6. The insulated gate silicon carbide semiconductor device according to claim 1,
    wherein said source region is in contact with said at least one of said plurality of trench sidewall surfaces provided with said second base region, in an upper portion of said second base region.

7. The insulated gate silicon carbide semiconductor device according to claim 1,
    wherein said gate electrode is disposed in a grid pattern.

8. The insulated gate silicon carbide semiconductor device according to claim 1,
    wherein said off-direction is an <11-20> direction.

9. The insulated gate silicon carbide semiconductor device according to claim 1,
    wherein said protective diffusion layer is formed at said bottom of said trench between said at least one of said plurality of trench sidewall surfaces provided with said second base region and at least a different one of said plurality of trench sidewall surfaces facing said at least one of said plurality of trench sidewall surfaces provided with said second base region.

10. The insulated gate silicon carbide semiconductor device according to claim 1,
    wherein a distance between said second base region and a trench sidewall surface on which said second base region is not formed is a distance more than or equal to a distance expressed by Math 1

$$(\text{Third distance}) \times \tan \theta_3 \quad [\text{Math 1}]$$

where a third distance represents a difference in depth between said first base region and said second base region and $\theta_3$ represents a spread angle at which electrons spread in a <0001> direction from the <0001> direction in silicon carbide.

11. An insulated gate silicon carbide semiconductor device, comprising:
    a silicon carbide substrate of 4H type having a main surface having an off-angle of more than 0° in an off-direction with respect to a {0001} plane;
    a drift layer of a first conductivity type provided on said silicon carbide substrate;
    a first base region of a second conductivity type located on a surface side of said drift layer;
    a source region of the first conductivity type located in said first base region;
    a trench provided so as to be in contact with said source region and to reach a portion of said drift layer beneath said first base region, and having a plurality of trench sidewall surfaces;
    a gate insulating film formed in said trench;
    a gate electrode buried in said trench through said gate insulating film;
    a protective diffusion layer of the second conductivity type provided in said drift layer while being in contact with a bottom of said trench; and
    a second base region of the second conductivity type provided in said drift layer while being in contact with said protective diffusion layer, said first base region, and at least part of at least one of said plurality of trench sidewall surfaces, said second base region being higher in impurity concentration of the second conductivity type than said first base region and said protective diffusion layer.

12. The insulated gate silicon carbide semiconductor device according to claim 11,
    wherein at least a different one of said plurality of trench sidewall surfaces facing said at least one of said plurality of trench sidewall surfaces provided with said second base region is not provided with said second base region.

13. The insulated gate silicon carbide semiconductor device according to claim 11,
    wherein said plurality of trench sidewall surfaces include an off-upstream trench sidewall surface positioned upstream in said off-direction, and an off-downstream trench sidewall surface positioned downstream of said off-upstream trench sidewall surface in said off-direction, and said second base region is provided with said off-upstream trench sidewall surface.

14. The insulated gate silicon carbide semiconductor device according to claim 11, wherein said trench tapers such that a width of said trench increases from said bottom to a top of said trench.

15. The insulated gate silicon carbide semiconductor device according to claim 11, wherein said source region is in contact with said at least one of said plurality of trench sidewall surfaces provided with said second base region, in an upper portion of said second base region.

16. The insulated gate silicon carbide semiconductor device according to claim 11, wherein said gate electrode is disposed in a grid pattern.

17. The insulated gate silicon carbide semiconductor device according to claim 11, wherein said off-direction is an <11-20> direction.

18. The insulated gate silicon carbide semiconductor device according to claim 11, wherein said protective diffusion layer is formed at said bottom of said trench between said at least one of said plurality of trench sidewall surfaces provided with said second base region and at least a different one of said plurality of trench sidewall surfaces facing said at least one of said plurality of trench sidewall surfaces provided with said second base region.

19. The insulated gate silicon carbide semiconductor device according to claim 11, wherein a distance between said second base region and a trench sidewall surface on which said second base region is not formed is a distance more than or equal to a distance expressed by Math 1

$$(\text{Third distance}) \times \tan \theta_3 \qquad [\text{Math 1}]$$

where a third distance represents a difference in depth between said first base region and said second base region and $\theta_3$ represents a spread angle at which electrons spread in a <0001> direction from the <0001> direction in silicon carbide.

20. The insulated gate silicon carbide semiconductor device according to claim 11, wherein, in a same plane perpendicular to a first sidewall surface of said trench, said second base region is in direct contact with said first sidewall surface from a bottom of said first base region to a top of said protective diffusion layer at the bottom of the trench and said drift layer is in direct contact with a second sidewall surface of said trench opposite said first sidewall surface from a bottom of said first base region to said protective diffusion layer.

21. The insulated gate silicon carbide semiconductor device according to claim 11, wherein a bottom of said protective diffusion layer is at substantially a same depth as a bottom of said second base region.

22. The insulated gate silicon carbide semiconductor device according to claim 11, wherein, in a direction perpendicular to a first sidewall surface of said trench, said second base region and said source region have a same width extending a first distance from first sidewall surface.

23. The insulated gate silicon carbide semiconductor device according to claim 1, wherein, in a same plane perpendicular to a first sidewall surface of said trench, said second base region is in direct contact with said first sidewall surface from a bottom of said first base region to a top of said protective diffusion layer at the bottom of the trench and said drift layer is in direct contact with a second sidewall surface of said trench opposite said first sidewall surface from a bottom of said first base region to said protective diffusion layer.

24. The insulated gate silicon carbide semiconductor device according to claim 1, wherein, in a direction perpendicular to a first sidewall surface of said trench, said second base region and said source region have a same width extending a first distance from first sidewall surface.

25. An insulated gate silicon carbide semiconductor device, comprising:

a silicon carbide substrate of 4H type having a main surface having an off-angle of more than 0° in an off-direction with respect to a {0001} plane;

a drift layer of a first conductivity type provided on said silicon carbide substrate;

a first base region of a second conductivity type located on a surface side of said drift layer;

a source region of the first conductivity type located in said first base region;

a trench provided so as to be in contact with said source region and to reach a portion of said drift layer beneath said first base region, and having a plurality of trench sidewall surfaces;

a gate insulating film formed in said trench;

a gate electrode buried in said trench through said gate insulating film;

a protective diffusion layer of the second conductivity type provided in said drift layer while being in contact with a bottom of said trench; and a second base region of the second conductivity type provided in said drift layer while being in contact with said protective diffusion layer, said first base region, and at least part of at least one of said plurality of trench sidewall surfaces, said first base region is in contact with at least a trench sidewall surface opposite to said trench sidewall surface which is provided with said second base region, and said first base region is in contact with said trench sidewall surfaces with which said source region is in contact.

26. An insulated gate silicon carbide semiconductor device, comprising:

a silicon carbide substrate of 4H type having a main surface having an off-angle of more than 0° in an off-direction with respect to a {0001} plane;

a drift layer of a first conductivity type provided on said silicon carbide substrate;

a first base region of a second conductivity type located on a surface side of said drift layer;

a source region of the first conductivity type located in said first base region;

a trench provided so as to be in contact with said source region and to reach a portion of said drift layer beneath said first base region, and having a plurality of trench sidewall surfaces;

a gate insulating film formed in said trench;

a gate electrode buried in said trench through said gate insulating film;

a protective diffusion layer of the second conductivity type provided in said drift layer while being in contact with a bottom of said trench; and a second base region of the second conductivity type provided in said drift layer while being in contact with said protective diffusion layer, said first base region, and at least part of at least one of said plurality of trench sidewall surfaces, said second base region is not provided in said trench sidewall surface opposite to said at least one of said plurality of trench sidewall surfaces, and said drift layer is disposed between said second base region and another trench adjacent to said trench.

* * * * *